(12) United States Patent
Saito et al.

(10) Patent No.: US 8,525,182 B2
(45) Date of Patent: Sep. 3, 2013

(54) THIN FILM TRANSISTOR, METHOD FOR MANUFACTURING SAME, DISPLAY DEVICE, AND METHOD FOR MANUFACTURING SAME

(75) Inventors: Nobuyoshi Saito, Kanagawa-ken (JP); Tomomasa Ueda, Kanagawa-ken (JP); Shintaro Nakano, Kanagawa-ken (JP); Shuichi Uchikoga, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 26 days.

(21) Appl. No.: 13/365,730

(22) Filed: Feb. 3, 2012

(65) Prior Publication Data

US 2012/0132909 A1    May 31, 2012

Related U.S. Application Data

(62) Division of application No. 12/620,112, filed on Nov. 17, 2009, now abandoned.

(30) Foreign Application Priority Data

Nov. 19, 2008 (JP) ................................. 2008-295853

(51) Int. Cl.
*H01L 27/14* (2006.01)

(52) U.S. Cl.
USPC ................................ 257/72; 257/59; 257/258

(58) Field of Classification Search
USPC ............................................ 257/59, 72, 258
See application file for complete search history.

(56) References Cited

U.S. PATENT DOCUMENTS

2010/0059751 A1    3/2010    Takahasi et al.

FOREIGN PATENT DOCUMENTS

| JP | 2002-42560 A | 2/2002 |
|---|---|---|
| JP | 2003-43522 A | 2/2003 |
| JP | 2004-103957 | 4/2004 |
| JP | 2007-59560 A | 3/2007 |
| JP | 2007-220820 A | 8/2007 |
| JP | 2008-40343 A | 2/2008 |
| JP | 2008-205469 | 9/2008 |

OTHER PUBLICATIONS

Donghun Kang, et al., "Amorphous gallium indium zinc oxide thin film transistors: Sensitive to oxygen molecules", Applied physics Letters 90, 192101, 2007, pp. 192101-1-192101-3.
Japanese Office Action issued Jul. 6, 2012 in patent application No. 2008-295853 with English translation.
Japanese Office Action issued Mar. 6, 2012, in Patent Application No. 2008-295853 (with English-language translation).

*Primary Examiner* — Tan N Tran
(74) *Attorney, Agent, or Firm* — Oblon, Spivak, McClelland, Maier & Neustadt, L.L.P.

(57) ABSTRACT

A thin film transistor includes: an insulating layer; a gate electrode provided on the insulating layer; a gate insulating film provided on the gate electrode; a semiconductor layer provided on the gate insulating film, the semiconductor layer being formed of oxide; a source electrode and a drain electrode provided on the semiconductor layer; and a channel protecting layer provided between the source and drain electrodes and the semiconductor layer. The source electrode is opposed to one end of the gate electrode. The drain electrode is opposed to another end of the gate electrode. The another end is opposite to the one end. The drain electrode is apart from the source electrode. The channel protecting layer covers at least a part of a side face of a part of the semiconductor layer. The part of the semiconductor layer is not covered with the source electrode and the drain electrode above the gate electrode.

14 Claims, 21 Drawing Sheets

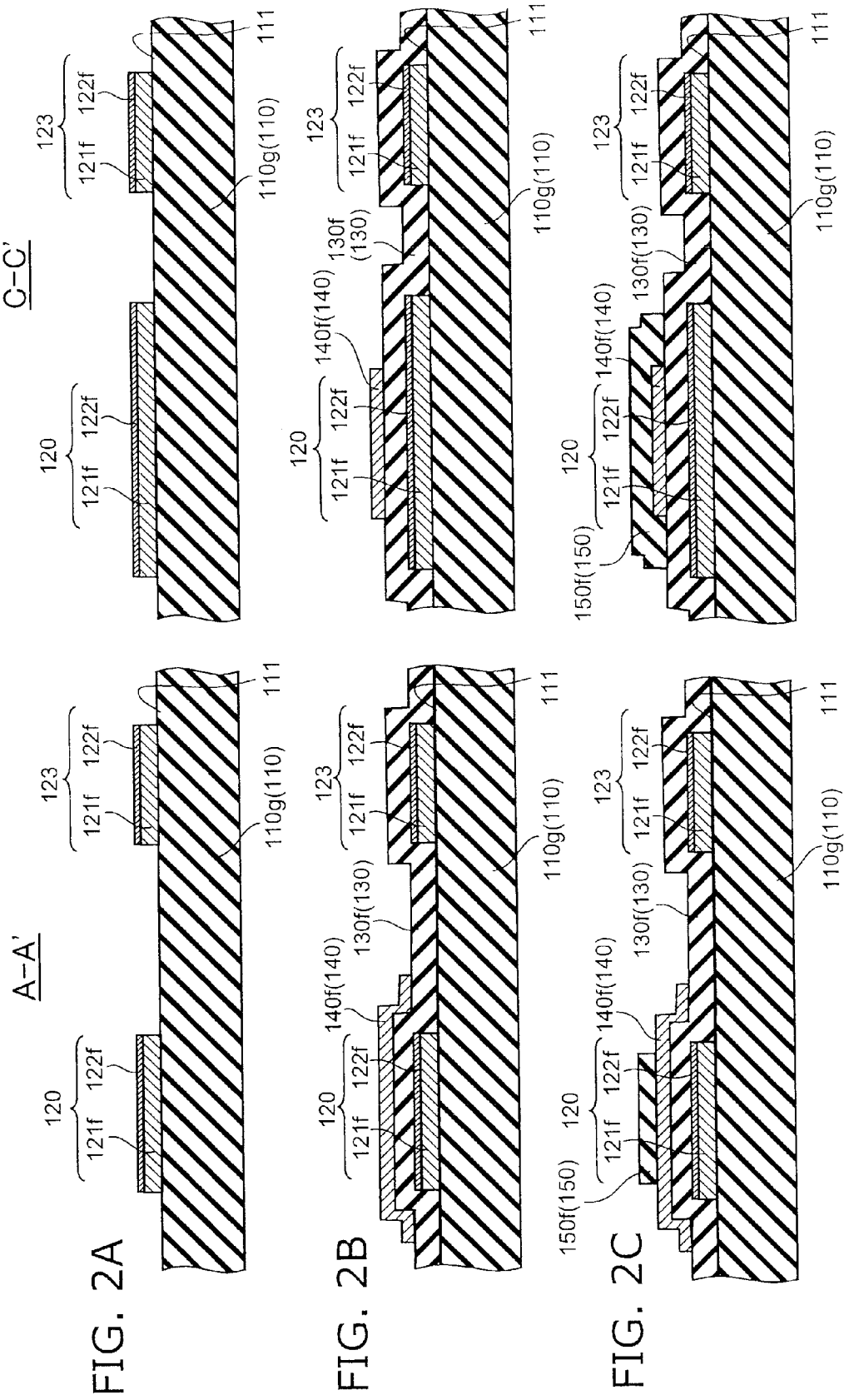

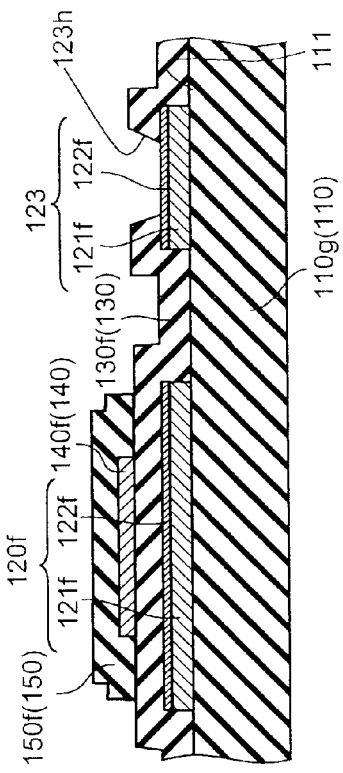
FIG. 3A
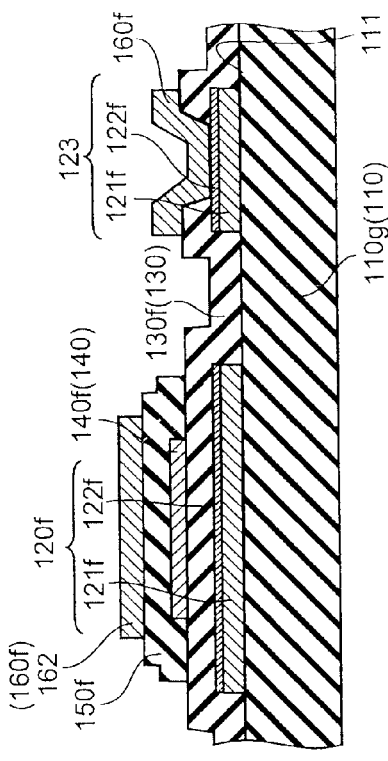
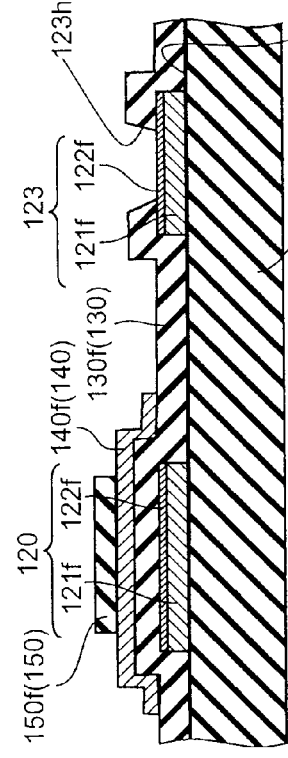
FIG. 3B
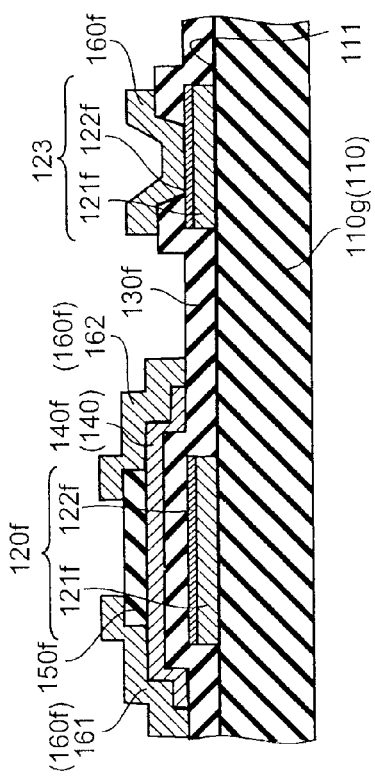

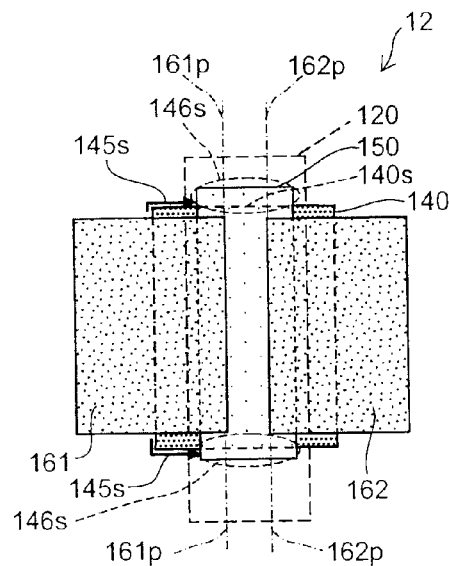
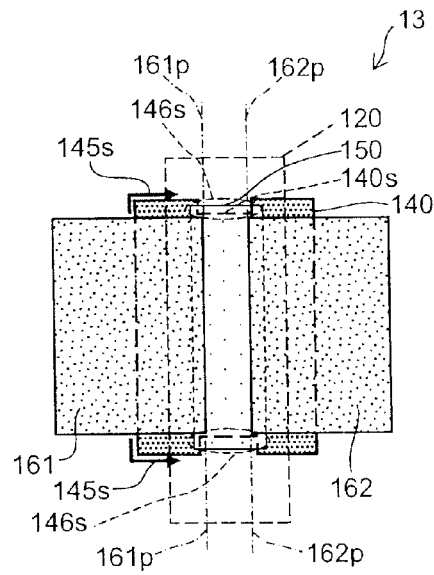
FIG. 9A  FIG. 9B
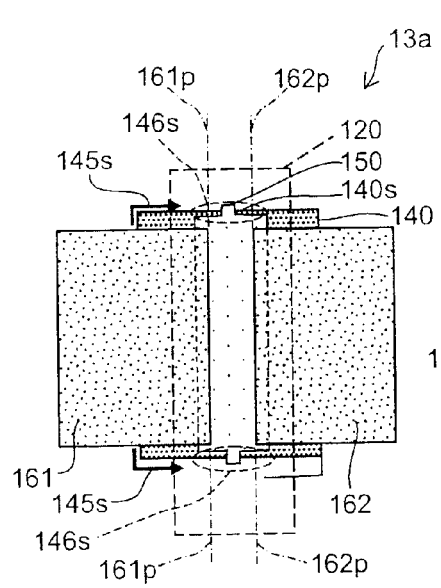
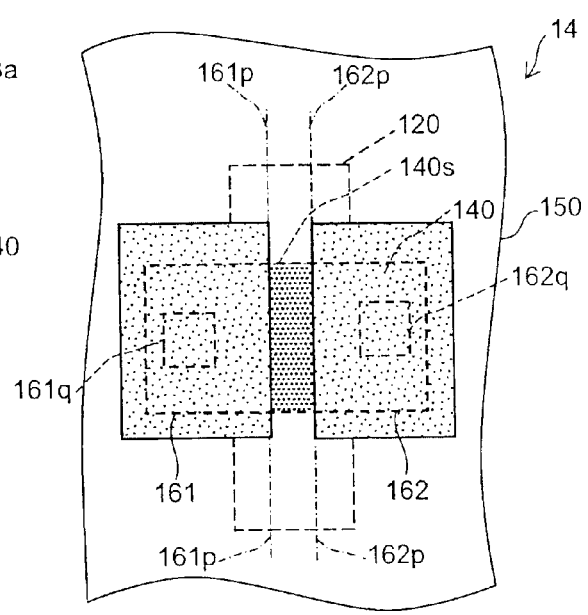
FIG. 9C  FIG. 9D

THIN FILM TRANSISTOR, METHOD FOR MANUFACTURING SAME, DISPLAY DEVICE, AND METHOD FOR MANUFACTURING SAME

CROSS-REFERENCE TO RELATED APPLICATIONS

This application is a Divisional of and claims the benefit of priority under 35 U.S.C. §120 from U.S. Ser. No. 12/620,112, filed Nov. 17, 2009, and claims the benefit of priority from the prior Japanese Patent Application No.2008-295853, filed on Nov. 19, 2008; the entire contents of which are incorporated herein by reference.

BACKGROUND OF THE INVENTION

1. Field of the Invention

The invention relates to a thin film transistor, a method for manufacturing the same, a display device, and a method for manufacturing the same.

2. Background Art

Thin film transistors (TFTs) are widely used for liquid crystal display devices, organic EL display devices, and the like.

Amorphous silicon TFTs used for large-size liquid crystal display devices have a mobility of approximately 1 cm$^2$/Vs and they can be formed uniformly with a large area at low cost. Further improvements in size and resolution are required these days. Furthermore, an active matrix organic EL display devices which require a large driving current have been developed, and a novel active material of low cost, high uniformity, high reliability, and high mobility is required.

In the development circumstances mentioned above, oxide semiconductors receive attention as a material usable for the channel layer of TFT in these days.

For example, TFTs which have a transparent conductive oxide thin film containing ZnO as a main component for the channel layer are developed actively. The thin film mentioned above can be film-formed with a large area at a relatively low temperature, and achieve a higher mobility than amorphous silicon. For example, JP-A 2004-103957 (Kokai) discloses a TFT using In—Ga—Zn—O-based amorphous oxide. Since the thin film mentioned above can be film-formed at a low temperature and is transparent in the visible range, it is considered that a flexible and transparent TFT can be formed on a substrate of plastic or film. Furthermore, approximately ten times as high field-effect mobility as amorphous silicon is obtained.

On the other hand, it is reported that, for example, the electric conductivity of oxide semiconductor changes with oxygen concentration during sputtering film-formation (for example, see Applied Physics Letters, 90, 192101 (2007)). Thus, in regard to oxide semiconductors, electrical characteristics are very sensitive to the concentration of contained oxygen, and the oxygen concentration changes due to heat treatment to cause deteriorated characteristics, for example. This is a major factor that prevents TFTs using an oxide semiconductor from their practical use.

SUMMARY OF THE INVENTION

According to an aspect of the invention, there is provided a thin film transistor including: an insulating layer; a gate electrode provided on the insulating layer; a gate insulating film provided on the gate electrode; a semiconductor layer provided on the gate insulating film, the semiconductor layer being formed of oxide; a source electrode and a drain electrode provided on the semiconductor layer, the source electrode being opposed to one end of the gate electrode, the drain electrode being opposed to another end of the gate electrode, the another end being opposite to the one end, the drain electrode being apart from the source electrode; and a channel protecting layer provided between the source and drain electrodes and the semiconductor layer, the channel protecting layer covering at least a part of a side face of a part of the semiconductor layer, the part of the semiconductor layer being not covered with the source electrode and the drain electrode above the gate electrode.

According to another aspect of the invention, there is provided a method for manufacturing a thin film transistor, the thin film transistor including: a substrate; a gate electrode provided on the substrate; a gate insulating film provided on the gate electrode; a semiconductor layer provided on the gate insulating film, the semiconductor layer being formed of oxide; a source electrode and a drain electrode provided on the semiconductor layer, the source electrode being opposed to one end of the gate electrode, the drain electrode being opposed to another end of the gate electrode, the another end being opposite to the one end, the drain electrode being apart from the source electrode; and a channel protecting layer provided between the source and drain electrodes and the semiconductor layer, the method including: forming the gate electrode on the substrate; forming the gate insulating film on the gate electrode; forming the semiconductor layer on the gate insulating film; forming the channel protecting layer covering at least a part of a side face of the semiconductor layer above the gate electrode; performing a heat treatment on the semiconductor layer and the channel protecting layer at a temperature not less than 160° C.; and forming the source electrode and the drain electrode on the semiconductor layer and the channel protecting layer after the performing the heat treatment.

According to another aspect of the invention, there is provided a display device including: a thin film transistor including: an insulating layer; a gate electrode provided on the insulating layer; a gate insulating film provided on the gate electrode; a semiconductor layer provided on the gate electrode, the semiconductor layer being formed of oxide; a source electrode and a drain electrode provided on the semiconductor layer, the source electrode being opposed to one end of the gate electrode, the drain electrode being opposed to another end of the gate electrode, the another end being opposite to the one end, the drain electrode being apart from the source electrode; and a channel protecting layer provided between the source and drain electrodes and the semiconductor layer, the channel protecting layer covering at least a part of a side face of a part of the semiconductor layer, the part of the semiconductor layer being not covered with the source electrode and the drain electrode above the gate electrode; a pixel electrode connected to one of the source electrode and the drain electrode, the pixel electrode being formed of the oxide and having a lower electric resistance than the semiconductor layer; and an optical element producing at least one of a change in optical characteristics and light emitting by an electric signal provided to the pixel electrode.

According to another aspect of the invention, there is provided a method for manufacturing a display device, the display device including: a thin film transistor including: a substrate; a gate electrode provide on the substrate; a gate insulating film provide on the gate electrode; a semiconductor layer provided on the gate insulating film, the semiconductor layer being formed of oxide; a source electrode and a drain electrode provided on the semiconductor layer, the source electrode being opposed to one end of the gate electrode, the drain electrode being opposed to another end of the gate electrode, the another end being opposite to the one end, the drain electrode being apart from the source electrode; and a channel protecting layer provided between the source and drain electrodes and the semiconductor layer; a pixel electrode connected to one of the source electrode and the drain electrode; and an optical element producing at least one of a change in optical characteristics and light emitting by an electric signal provided to the pixel electrode, the method including: forming the gate electrode on the substrate; forming the gate insulating film on the gate electrode; forming a layer of the oxide on the gate insulating film; forming the channel protecting layer covering at least a part of a side face of the layer of the oxide above the gate electrode and exposing the layer of the oxide in a third region, the pixel electrode being to be formed in the third region; performing a heat treatment on the layer of the oxide and the channel protecting layer at a temperature not less than 160° C. to decrease an electric resistance of the layer of the oxide not covered with the channel protecting layer to form the pixel electrode; and forming the source electrode and the drain electrode on the semiconductor layer and the channel protecting layer after the performing the heat treatment.

According to another aspect of the invention, there is provided a method for manufacturing a display device, the display device including: a thin film transistor including: a substrate; a gate electrode provided on the substrate; a gate insulating film provided on the gate electrode; a semiconductor layer provided on the gate insulating film, the semiconductor layer being formed of oxide; a source electrode and a drain electrode provided on the semiconductor layer, the source electrode being opposed to one end of the gate electrode, the drain electrode being opposed to another end of the gate electrode, the another end being opposite to the one end, the drain electrode being apart from the source electrode; and a channel protecting layer provided between the source and drain electrodes and the semiconductor layer; a pixel electrode connected to one of the source electrode and the drain electrode; and an optical element producing at least one of a change in optical characteristics and light emitting by an electric signal provided to the pixel electrode, the method including: forming the gate electrode on the substrate; forming the gate insulating film on the gate electrode; performing surface processing selectively changing smoothness of a surface of the gate insulating film; and forming a layer of the oxide on the gate insulating film.

BRIEF DESCRIPTION OF THE DRAWINGS

FIGS. 2A to 2C are sequential schematic cross-sectional views illustrating a method for manufacturing a thin film transistor according to a first example of the invention;

FIGS. 3A and 3B are sequential schematic cross-sectional views continuing from FIG. 2C;

FIGS. 9A to 9D are schematic planar views each illustrating the configuration of a thin film transistor of a modification example according to the first embodiment of the invention;

DETAILED DESCRIPTION OF THE INVENTION

Embodiments of the invention will now be described with reference to the drawings.

The drawings are schematic or conceptual; and the relationships between the thickness and width of portions, the proportions of sizes among portions, and the like are not necessarily the same as the actual values thereof. Further, the dimensions and proportions may be illustrated differently among drawings, even for identical portions.

In the specification and drawings of the application, components similar to those described in regard to a drawing thereinabove are marked with the same reference signs, and a detailed description is omitted as appropriate.

(First Embodiment)

FIGS. 1A to 1D are schematic cross-sectional views illustrating the configuration of a thin film transistor according to a first embodiment of the invention.

Figures 1A, 1B:
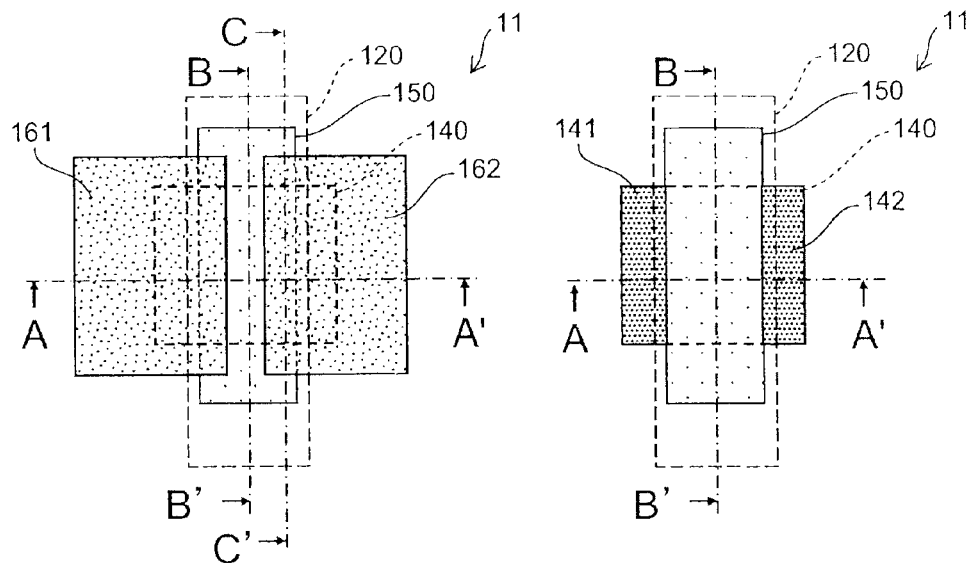
FIGS. 1A to 1D are schematic cross-sectional views illustrating the configuration of a thin film transistor according to a first embodiment of the invention.
Figure 1C:
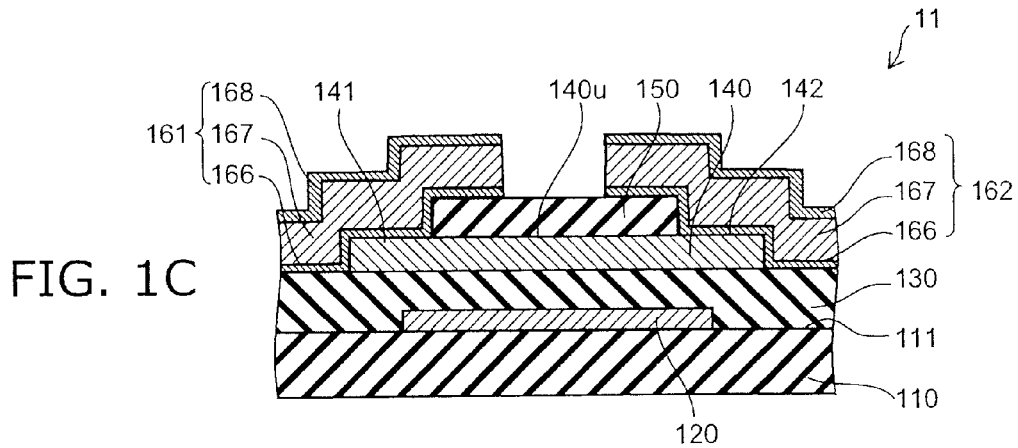
Figure 1D:
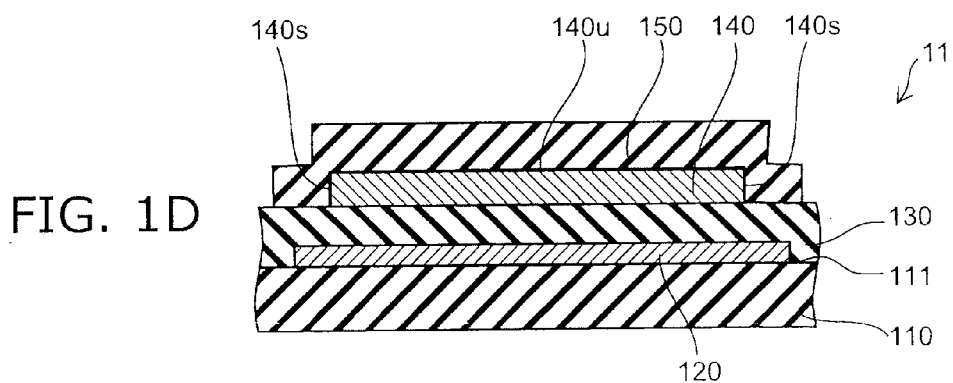

That is, FIG. 1A is a schematic plan view, FIG. 1B is an omitted schematic plan view, and FIG. 1C and FIG. 1D are cross-sectional views taken along line A-A' and line B-B' of FIG. 1A, respectively.

As illustrated in FIGS. 1A to 1D, a thin film transistor 11 according to the first embodiment of the invention includes: a gate electrode 120 provided on a major face 111 of an insulating layer 110; a semiconductor layer 140 provided above the gate electrode 120 via a gate insulating film 130 and formed of oxide; a channel protecting layer 150 provided on the semiconductor layer 140; and a source electrode 161 and a drain electrode 162 provided away from each other so as to cover part of the semiconductor layer 140 and part of the channel protecting layer 150.

In FIG. 1A, the insulating layer 110 and the gate insulating film 130 are omitted, and in FIG. 1B, the insulating layer 110, the gate insulating film 130, the source electrode 161, and the drain electrode 162 are omitted.

As illustrated in FIG. 1B, the semiconductor layer 140 includes a source contact region 141 and a drain contact region 142 that are electrically connected to the source electrode 161 and the drain electrode 162, respectively. The source contact region 141 and the drain contact region 142 are provided away from each other. The source electrode 161 is opposed to one end of the gate electrode 120. The drain electrode 162 is opposed to another end of the gate electrode 120. The another end is opposite to the one end. The drain electrode 162 is apart from the source electrode 161.

The channel protecting layer 150 is provided so as to cover a side face 140s and an upper face 140u of the semiconductor layer 140 except the source contact region 141 and the drain contact region 142. However, as described below, the channel protecting layer 150 may be provided so as to cover the upper face 140u and at least part of the side face 140s of the semiconductor layer 140.

That is, the thin film transistor 11 includes: the insulating layer 110; the gate electrode 120 provided on the insulating layer 110; the gate insulating film 130 provided on the gate electrode 120; the semiconductor layer 140 provided on the gate insulating film 130, the semiconductor layer 140 being made of oxide; the source electrode 161 and the drain electrode 162 provided on the semiconductor layer 140, the source electrode 161 being opposed to one end of the gate electrode 120, the drain electrode 162 being opposed to another end of the gate electrode 120, the another end being opposite to the one end, the drain electrode 162 being apart from the source electrode 161; and the channel protecting layer 150 provided between the source and drain electrodes 161, 162 and the semiconductor layer 140, the channel protecting layer 150 covering at least a part of the side face 140s of the semiconductor layer 140 not covered with the source electrode 161 and the drain electrode 162 above the gate electrode 120.

The insulating layer 110 is provided on a substrate, for example. At this time, a transparent glass substrate, for example, may be used for the substrate. However, it is not limited thereto, but a plastic substrate, a substrate with a color filter, and a non-transparent substrate of silicon, stainless steel, etc., for example, may be used. Further, if the substrate has insulating properties, the substrate itself may be used as the insulating layer 110. In the following, descriptions are given with the case taken up where the insulating layer 110 is an insulative substrate.

For the gate electrode 120, a high melting point metal such as MoW, Ta, and W may be used, for example. Further, Al alloys containing Al as a main component which are submitted with hillock preventions, or stacked films of Al and a high melting point metal may be used. However, the invention is not limited thereto, but an optional conductive material may be used for the gate electrode 120.

For the gate insulating film 130, silicon oxide ($SiO_x$) may be used, for example. However, the invention is not limited thereto, but an optional insulating film of silicon nitride ($SiN_x$), silicon oxynitride, etc. may be used. Further, stacked films of them may be used.

For the semiconductor layer 140, an amorphous oxide semiconductor of In—Ga—Zn—O type and the like may be used, for example. The semiconductor layer 140 made of this amorphous oxide semiconductor is formed by reactive sputtering, for example. When the amorphous oxide semiconductor layer is observed by using, for example, a transmission electron microscope or X-ray diffraction, no diffraction pattern and the like are observed. In addition to the above, an optional oxide semiconductor containing, for example, Zn or the like may be used for the semiconductor layer 140.

Thus, the semiconductor layer 140 may include an amorphous oxide which contains Zn. The amorphous oxide may further contain at least one of In and Ga.

Approximately 10 nm (nanometers) are enough for the thickness of the semiconductor layer 140 in order to ensure electrical characteristics. Specifically, the semiconductor layer 140 may have a thickness of approximately 10 nm to 100 nm.

For the channel protecting layer 150, a material, such as silicon oxide, having higher resistance against acids than the semiconductor layer 140 is used. However, the invention is not limited thereto, but an optional insulating material containing oxygen may be used. For example, alumina, silicon oxynitride, and the like also may be used. Further, stacked films of these films may be used.

For the source electrode 161 and the drain electrode 162, an optional conductive material may be used. Further, for example, optional conductive stacked films such as Ti/Al/Ti and Mo/Al/Mo may be used. In this specific example, stacked films of a Mo film 166, an Al film 167, and a Mo film 168 are used for the source electrode 161 and the drain electrode 162.

In the above, the source contact region 141 and the drain contact region 142 may be mutually exchanged. That is, the source electrode 161 and the drain electrode 162 may be mutually exchanged.

In order to maintain reliability of the thin film transistor 11, a passivation film illustratively made of an insulating material such as $SiN_x$ and the like is formed so as to cover the entire structure illustrated in the drawings. However, the passivation film is omitted in the drawings. Further, an insulating layer of an organic resin etc. for planarization and, depending on circumstances, an insulating layer of a colored organic resin etc. such as a color filter are formed thereon. However, these films are omitted in the drawings.

Thus, in the case where a thin film transistor is generally used for display devices of active matrix type for TFT-LCDs or organic EL, and the like, the passivation film is formed, and at this time the thin film transistor receives a heat treatment at a temperature of 150° C. or higher, for example. Further, when forming the passivation film by using, for example, PE-CVD (plasma enhanced chemical vapor deposition), the heating temperature is approximately 250° C.

At this time, the semiconductor layer 140 is heated during formation of the passivation layer mentioned above. Here, in the thin film transistor 11 according to this embodiment, the source contact region 141 and the drain contact region 142 of the semiconductor layer 140 are covered with the source electrode 161 and the drain electrode 162, respectively. Further, in a region of the semiconductor layer 140 not covered with these electrodes, the upper face 140u and the side face 140s of the semiconductor layer 140 are covered with the channel protecting layer 150. This suppresses variation in oxygen concentration at the semiconductor layer 140 when the heat treatment mentioned above is performed, and characteristics are not changed.

Thus, the thin film transistor 11 according to this embodiment can provide a thin film transistor based on an oxide semiconductor which suppresses variation in oxygen concentration caused by heat treatment to suppress characteristic variation.

FIRST EXAMPLE

A thin film transistor 11a (not illustrated) according to a first example of this embodiment has the structure illustrated in FIGS. 1A to 1D. A method for manufacturing the thin film transistor 11a of the first example will now be described.

FIGS. 2A to 2C are sequential schematic cross-sectional views illustrating a method for manufacturing the thin film transistor according to the first example of the invention.

FIGS. 3A and 3B are sequential schematic cross-sectional views continuing from FIG. 2C.

In each of FIGS. 2A to 3B, the drawing on the left side is a cross-sectional view corresponding to the cross-section taken along line A-A' of FIG. 1A, and the drawing on the right side is a cross-sectional view corresponding to the cross-section taken along line C-C' of FIG. 1A. In these drawings, a contact unit is also illustrated in addition to the portion of the thin film transistor.

As illustrated in FIG. 2A, first, an Al film 121f and an Mo film 122f were film-formed with thicknesses of 100 nm and 30 nm, respectively, on the major face 111 of a glass substrate 110g (substrate 110g) that is the insulating layer 110 by sputtering, and were patterned into a prescribed pattern to form a gate electrode 120. Photolithography was used for the patterning, and a mixed acid of phosphoric acid, acetic acid, nitric acid, and water was used for the etching. At this time, a contact unit 123 of the gate electrode 120 of the thin film transistor was also formed simultaneously. The contact unit 123 is also formed of stacked films of the Al film 121f and the Mo film 122f.

Next, as illustrated in FIG. 2B, an $SiO_2$ film 130f was deposited with a thickness of 200 nm as a gate insulating film 130, by PE-CVD using TEOS (tetraethyl orthosilicate) as raw material. At this time, the film-formation temperature was 350° C.

Further, on the gate insulating film 130, an oxide layer 140f (a layer of oxide) made of In—Ga—Zn—O oxide which forms a semiconductor layer 140 was film-formed with a thickness of 30 nm by reactive DC sputtering. At this time, the ratio of oxygen was 5% to argon. Then, the oxide layer 140f was patterned into a prescribed pattern across the gate electrode 120 by using oxalic acid of 2%, and thus the semiconductor layer 140 was formed.

Further, as illustrated in FIG. 2C, an $SiO_2$ film 150f which forms a channel protecting layer 150 was deposited with a thickness of 200 nm by PE-CVD of TEOS. At this time, the film-formation gas was a mixed gas of $O_2$ and TEOS, and the film-formation temperature was 350° C. After that, the $SiO_2$ film 150f was patterned into a prescribed pattern covering the side face 140s and the upper face 140u of the semiconductor layer 140 except regions that form later the source contact region 141 and the drain contact region 142, and thus the channel protecting layer 150 was formed.

At this time, mask exposure and back face exposure using the gate electrode 120 as a mask were used in combination for lithography at the time of patterning of the $SiO_2$ film 150f. The etching was performed by RIE (reactive ion etching) using $CF_4$ gas.

After that, annealing was performed at 350° C. for one hour under an air atmosphere to remove damages in the semiconductor layer 140 due to the PE-CVD process for film-formation of the $SiO_2$ film 150f.

Then, as illustrated in FIG. 3A, a contact hole 123h was formed in the $SiO_2$ film 130f that forms the gate insulating film 130 in the contact unit 123 for extracting the gate electrode 120. That is, the $SiO_2$ film 130f of the gate insulating film 130 was etched into a prescribed shape by using buffered hydrofluoric acid.

Then, as illustrated in FIG. 3B, the Mo film 166, the Al film 167, and the Mo film 168 (not illustrated) that form the source electrode 161 and the drain electrode 162 were film-formed with thicknesses of 10 nm, 300 nm, and 50 nm, respectively, by sputtering to form stacked films 160f, and the stacked films 160f were patterned into a prescribed pattern by using a mixed acid to form the source electrode 161 and the drain electrode 162. Thereby, the configuration of the thin film transistor 11a is completed. Further, the stacked films 160f of the Mo film 166, the Al film 167, and the Mo film 168 are buried in the contact hole 123h, and are patterned into a prescribed shape to form the contact unit 123.

After that, in order to remove element damages during the processes, annealing is performed in a clean oven at 230° C. for approximately one hour. Thereby, the thin film transistor 11a according to this example is completed.

Figure 4:
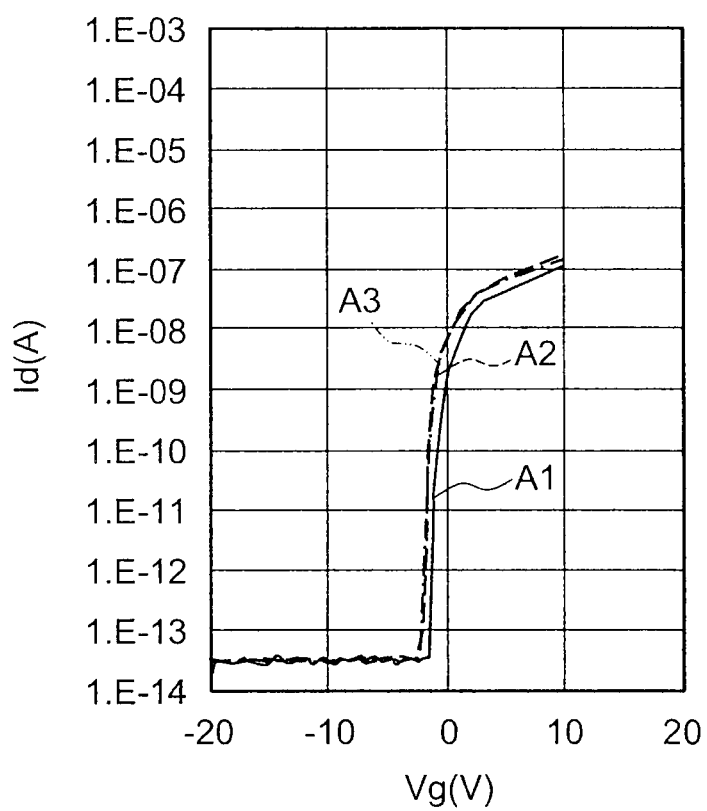
FIG. 4 is a graph illustrating characteristics of the thin film transistor according to the first example of the invention.

FIG. 4 is a graph illustrating characteristics of the thin film transistor according to the first example of the invention.

That is, the drawing illustrates characteristics in the case where a heat treatment is performed after the thin film transistor 11a according to the first example is completed and the heat treatment conditions are changed. A solid line A1 illustrates the initial characteristics without the heat treatment, a broken line A2 illustrates the characteristics after a heat treatment of 160° C. under an Ar atmosphere, and an alternate long and short dash line A3 illustrates the characteristics after a heat treatment of 230° C. under an Ar atmosphere. In the drawing, the horizontal axis represents the gate voltage Vg, and the vertical axis represents the drain current Id.

As illustrated in FIG. 4, in the thin film transistor 11a, a high ON/OFF ratio is obtained in each case of the initial characteristics without the heat treatment (solid line A1), the 160° C. heat treatment (broken line A2), and the 230° C. heat treatment (alternate long and short dash line A3), and further, characteristics are little changed by the heat treatment. These are effects of covering the semiconductor layer 140 with the channel protecting layer 150, the source electrode 161, and the drain electrode 162, and thereby suppressing change in the concentration of oxygen contained in the semiconductor layer 140 due to the heat treatment. Thereby, stable operation is achieved.

FIRST COMPARATIVE EXAMPLE

FIGS. 5A to 5D are schematic cross-sectional views illustrating the configuration of a thin film transistor of a first comparative example.

Figures 5A, 5B:
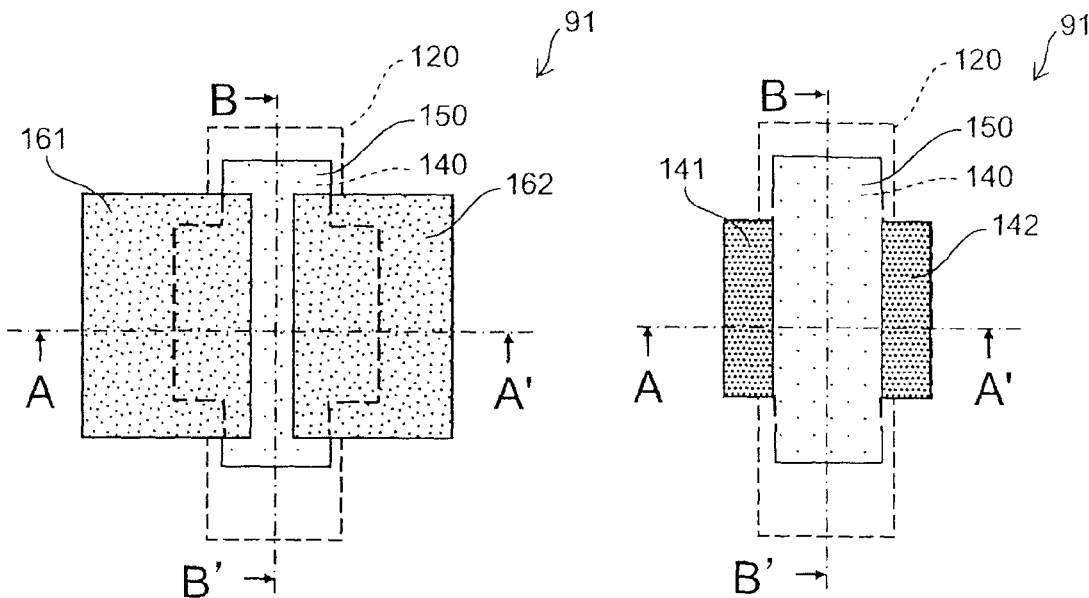
FIGS. 5A to 5D are schematic cross-sectional views illustrating the configuration of a thin film transistor of a first comparative example.
Figure 5C:
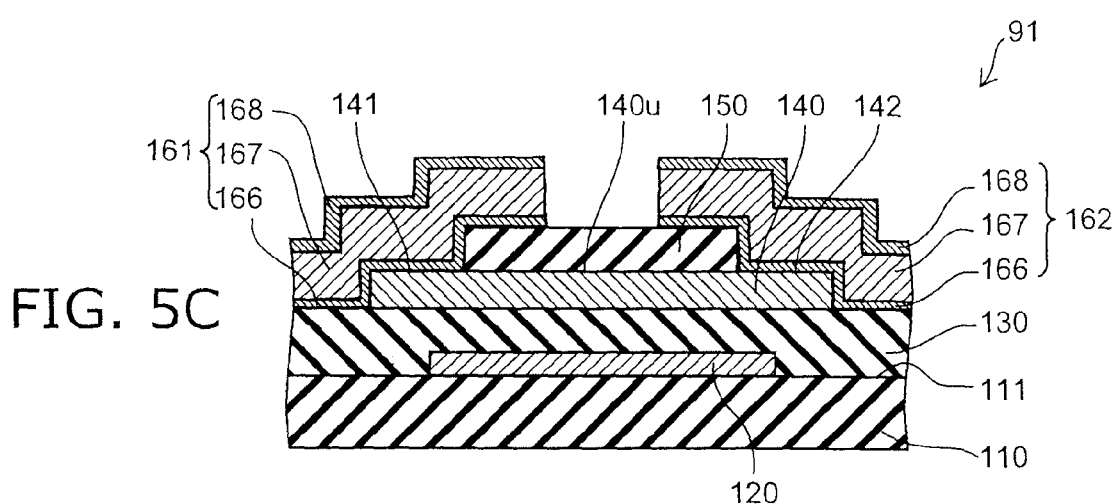
Figure 5D:
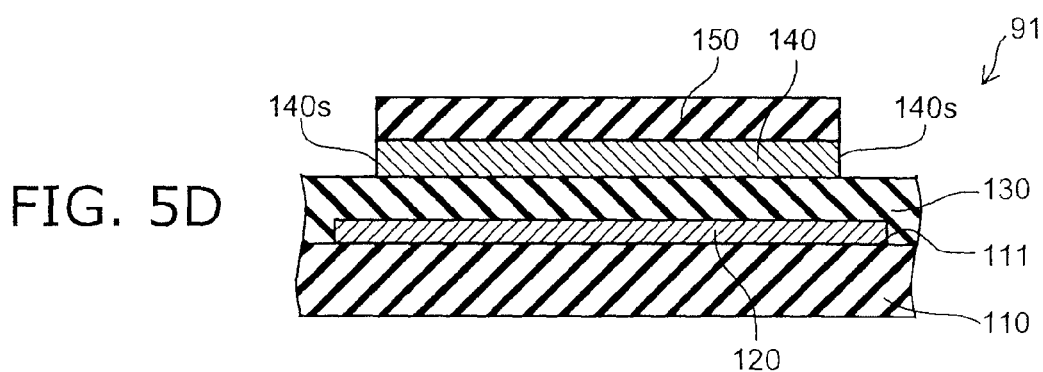

That is, FIG. 5A is a schematic plan view, FIG. 5B is an omitted schematic plan view, and FIG. 5C and FIG. 5D are cross-sectional views taken along line A-A' and line B-B' of FIG. 5A, respectively.

As illustrated in FIGS. 5A to 5D, in a thin film transistor 91 of the first comparative example, the channel protecting layer 150 is provided so as to cover the upper face 140u of the semiconductor layer 140 but to expose the side face 140s. The others are like the thin film transistor 11 according to this embodiment and therefore a description is omitted. That is, the thin film transistor 91 of the first comparative example has a structure in which the side face 140s of the semiconductor layer 140 is not covered with the channel protecting layer 150 in the thin film transistor 11 according to the first embodiment and the thin film transistor 11a of the first example.

The configuration of this thin film transistor 91 is general in the case where a silicon-based semiconductor such as amorphous silicon and polysilicon is used instead of an oxide semiconductor as the semiconductor layer 140.

The thin film transistor 91 is fabricated as follows.

The Al film 121f and the Mo film 122f that form the gate electrode 120 are film-formed with thicknesses of 100 nm and 30 nm, respectively, on the major face 111 of the insulating layer 110 such as a glass substrate by sputtering, and are patterned into a prescribed pattern. Photolithography is used for the patterning, and a mixed acid of phosphoric acid, acetic acid, nitric acid, and water is used for the etching.

After that, the $SiO_2$ film 130f is deposited with a thickness of 200 nm as the gate insulating film 130 by PE-CVD of TEOS. Further, the oxide layer 140f made of In—Ga—Zn—O oxide is film-formed with a thickness of 30 nm on the gate insulating film 130 as the semiconductor layer 140 by reactive DC sputtering. The ratio of oxygen is 5% to argon.

Then, the $SiO_2$ film 150f is deposited with a thickness of 200 nm as the channel protecting layer 150 by PE-CVD of TEOS. After that, this $SiO_2$ film 150f is patterned into a prescribed pattern. At this time, mask exposure and back face exposure using the gate electrode 120 as a mask were used in combination for photolithography for patterning of the $SiO_2$ film 150f. The etching was performed by RIE using $CF_4$ gas.

Then, the oxide layer 140f is patterned into a prescribed pattern by using oxalic acid of 2%. After that, in order to cause the semiconductor layer 140 to recover from damages during PE-CVD, annealing is performed at 350° C. for one hour under an air atmosphere. After that, in order to form a contact hole (not illustrated) for extracting the gate electrode 120, the exposed gate insulating film 130 is etching-removed by using buffered hydrofluoric acid. Further, the Mo film 166, the Al film 167, and the Mo film 168 that form the source electrode 161 and the drain electrode 162 are film-formed with thicknesses of 10 nm, 30 nm, and 50 nm, respectively, by sputtering, and are patterned into a prescribed pattern by using the mixed acid mentioned above. After that, in order to cause the semiconductor layer 140 to recover from damages during the processes, annealing is performed at 230° C. for one hour under an air atmosphere.

In the thin film transistor 91 having such a configuration, characteristics vary greatly during a heat treatment of subsequent passivation film formation, and causing a practical problem.

Figure 6:
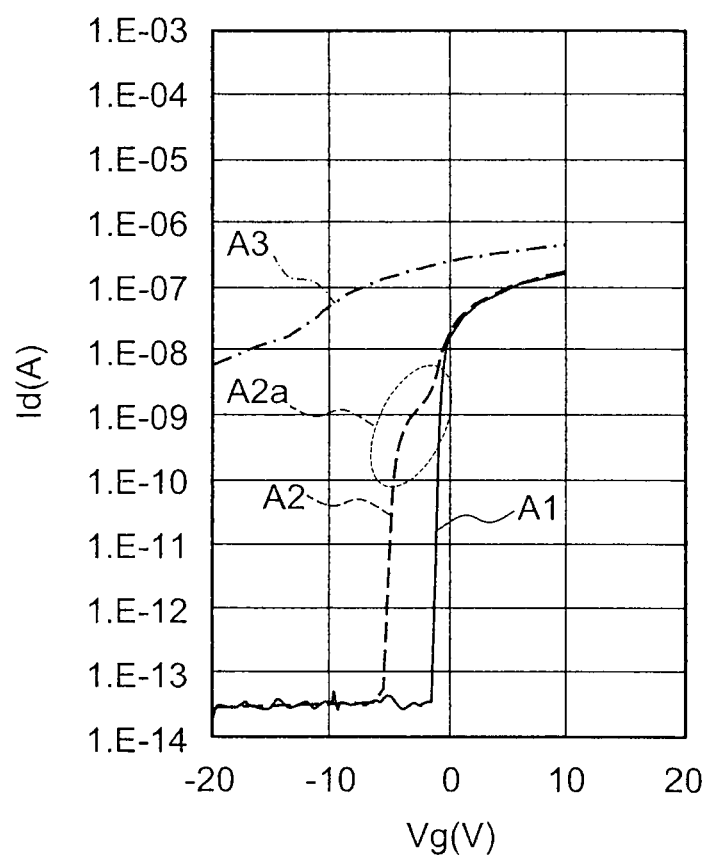
FIG. 6 is a graph illustrating characteristics of the thin film transistor of the first comparative example.

FIG. 6 is a graph illustrating characteristics of the thin film transistor of the first comparative example.

That is, the drawing illustrates characteristics in the case where a heat treatment is performed after the thin film transistor 91 of the first comparative example is completed, and the heat treatment conditions are changed. A solid line A1 illustrates the initial characteristics without the heat treatment, a broken line A2 illustrates the characteristics after the heat treatment of 160° C. under an Ar atmosphere, and an alternate long and short dash line A3 illustrates the characteristics after the heat treatment of 230° C. under an Ar atmosphere. In the drawing, the horizontal axis represents the gate voltage Vg, and the vertical axis represents the drain current Id.

As illustrated in FIG. 6, in the thin film transistor 91, a high ON/OFF ratio is obtained in the case of the initial characteristics without the heat treatment (solid line A1). However, in the case of the heat treatment of 160° C. (broken line A2), the Id-Vg characteristic curved line shifts in the direction of low Vg, and there is a convex A2a on the Id-Vg characteristic curved line. Further, in the case of the heat treatment of 230° C. (alternate long and short dash line A3), the ON/OFF ratios are very low, and mostly the ON state is presented (conduction state).

This is because, in the thin film transistor 91, the side face 140s of the semiconductor layer 140 is not covered with the channel protecting layer 150, and therefore the oxygen concentration at the surface of the side face 140s of the semiconductor layer 140 changes due to the heat treatment. Specifically, oxygen contained in the semiconductor layer 140 leaves the semiconductor layer 140, which makes the semiconductor layer 140 low resistive.

SECOND COMPARATIVE EXAMPLE

Figure 7A:
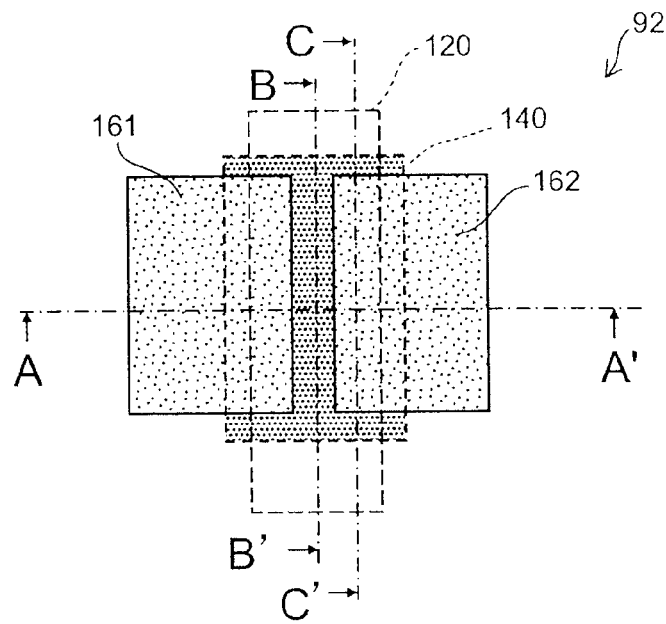
FIGS. 7A to 7C are schematic cross-sectional views illustrating the configuration of a thin film transistor of a second comparative example.
Figure 7B:
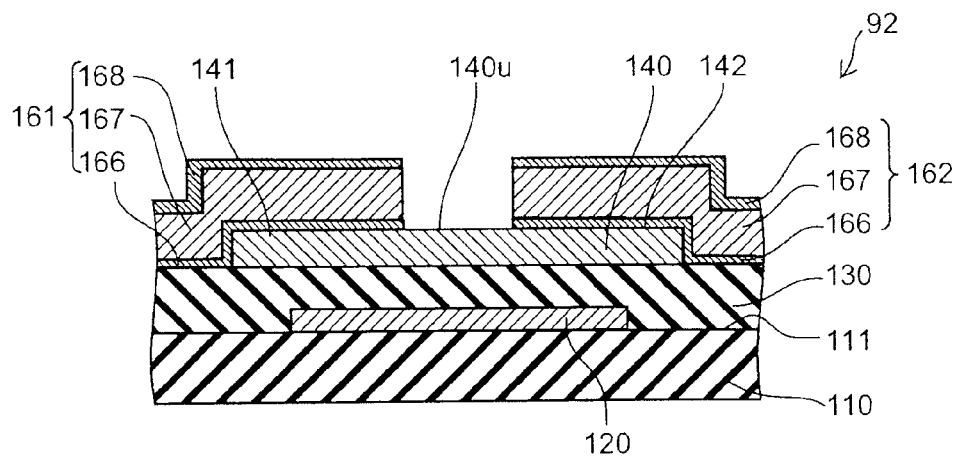
Figure 7C:
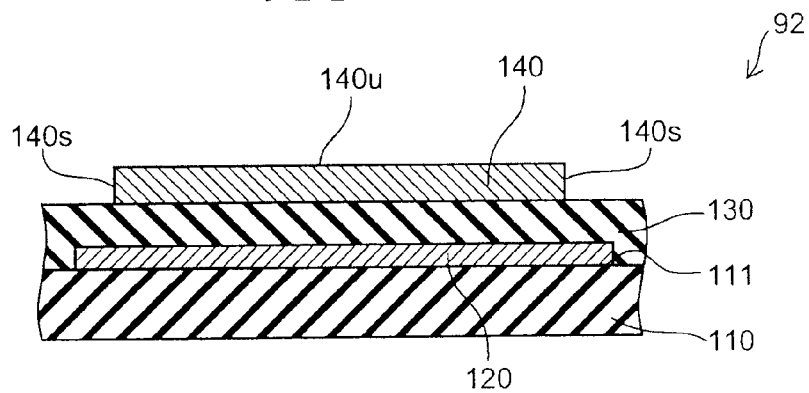

FIGS. 7A to 7C are schematic cross-sectional views illustrating the configuration of a thin film transistor of a second comparative example.

That is, FIG. 7A is a schematic plan view, and FIG. 7B and FIG. 7C are cross-sectional views taken along line A-A' and line B-B' of FIG. 7A, respectively.

As illustrated in FIGS. 7A to 7C, the thin film transistor 92 of the second comparative example does not include the channel protecting layer 150. That is, the thin film transistor 92 has a back channel cut structure. The thin film transistor 92 is fabricated as follows.

The Al film 121f and the Mo film 122f that form the gate electrode 120 are film-formed with thicknesses of 100 nm and 30 nm, respectively, on the major face 111 of the insulating layer 110 such as a glass substrate by sputtering, and are patterned into a prescribed pattern. Photolithography is used for the patterning, and a mixed acid of phosphoric acid, acetic acid, nitric acid, and water is used for the etching.

Then, the $SiO_2$ film 130f is deposited with a thickness of 200 nm as the gate insulating film 130 by PE-CVD of TEOS. Further, on the gate insulating film 130, the oxide layer 140f made of In—Ga—Zn—O oxide is film-formed with a thickness of 30 nm as the semiconductor layer 140 by reactive DC sputtering. The ratio of oxygen is 5% to argon. Then, the oxide layer 140f is patterned into a prescribed pattern by using oxalic acid of 2%, and thus the semiconductor layer 140 is formed After that, in order to form a contact hole (not illustrated) for extracting the gate electrode 120, the exposed gate insulating film 130 is etching-removed by using buffered hydrofluoric acid. Further, the Mo film 166, the Al film 167, and the Mo film 168 that form the source electrode 161 and the drain electrode 162 are film-formed with thicknesses of 10 nm, 300 nm, and 50 nm, respectively, by sputtering, and are patterned into a prescribed pattern by using the mixed acid mentioned above. After that, in order to cause the semiconductor layer 140 to recover from damages during the processes, annealing is performed at 230° C. for one hour under an air atmosphere.

In the thin film transistor 92 having such a configuration, since the channel protecting layer 150 is not provided, the upper face 140u and the side face 140s of the semiconductor layer 140 are exposed. Accordingly, characteristics vary greatly due to a heat treatment for subsequent formation of the passivation film and the like. For example, characteristics deteriorate due to the heat treatment more significantly than the characteristics of the thin film transistor 91 illustrated in FIG. 6, and causing a greater practical problem. This is because oxygen contained in the semiconductor layer 140 leaves the exposed upper face 140u and the exposed side face 140s of the semiconductor layer 140, and thereby the semiconductor layer 140 becomes low resistive.

In the case where a thin film transistor is generally used for display devices of active matrix type for TFT-LCDs or organic EL, and the like, it is necessary to form the passivation film in order to improve reliability. However, in the thin film transistors 91 and 92 of the first and second comparative examples mentioned above, electrical characteristics deteriorate by being exposed to an inert atmosphere or a vacuum at a temperature of 150° C. or higher. This is because oxygen at the exposed portion of the surface of the oxide layer 140f made of In—Ga—Zn—O oxide leaves the oxide layer 140f, and thereby the semiconductor layer 140 becomes low resistive. In general, in the case where the passivation film is formed by using PE-CVD, it is necessary to perform a heat treatment of approximately 200° C. in view of the barrier properties of the passivation film. However, in the thin film transistors 91 and 92, characteristics deteriorate if such a heat treatment is performed.

At this time, for example, performing a heat treatment at 350° C. or higher in an oxidizing atmosphere enables to recover characteristics from the deterioration. However, if such a high temperature treatment is performed, a reaction occurs between the In—Ga—Zn—O oxide of the semiconductor layer 140, and the source electrode 161 and the drain electrode 162, for example, which results in deteriorated characteristics. Further, if Al is used for the source electrode 161 and the drain electrode 162, a hillock occurs at these electrodes and the problem occurs that this hillock damages the passivation film, for example. Thus, employing the heat treatment mentioned above is difficult practically.

In contrast, in the thin film transistor 11 according to this embodiment and the thin film transistor 11a according to the first example, the upper face 140u and the side face 140s of the semiconductor layer 140 are covered with the channel protecting layer 150, the source electrode 161 and the drain electrode 162. This suppresses change of the concentration of oxygen contained in the semiconductor layer 140 due to a heat treatment. Thus, stable operation can be achieved even if the heat treatment during formation of the passivation film and the like is performed, as illustrated in FIGS. 2A to 2C.

As described above, in the thin film transistor using an oxide semiconductor, the side face 140s as well as the upper face 140u of the semiconductor layer 140 is covered with the channel protecting layer 150, and thereby good characteristics resistant to the heat treatment are obtained. The structure of the thin film transistor 11 according to this embodiment and the effects thereof have been found on the bases of the following experimental results.

The inventors forecasted that, in the thin film transistor 92 of the second comparative example which does not use the channel protecting layer 150, characteristics would deteriorate due to the heat treatment. That is, in a configuration where the channel protecting layer 150 is not employed, the semiconductor layer 140 is easily damaged in various kinds of processes during the manufacturing processes, and also in a thin film transistor using a semiconductor layer of amorphous silicon, polysilicon, or the like, for example, characteristics deteriorate according to circumstances. Therefore, the inventors presumed that the semiconductor layer 140 would be damaged more easily in the case of using an oxide semiconductor in which characteristics vary easily.

On the other hand, there is no problem in the case where, for example, not an oxide semiconductor but a silicon-based semiconductor such as amorphous silicon and polysilicon is used as the semiconductor layer 140 in the configuration of the thin film transistor 91 of the first comparative example illustrated in FIGS. 5A to 5D. That is, in amorphous silicon, polysilicon, and the like, although hydrogen on the surface leaves due to the heat treatment on some occasions, the portion where hydrogen has left becomes high resistive, and therefore there is generally no problem. Accordingly, even if the side face of the semiconductor layer 140 is exposed, significant change in characteristics due to the heat treatment does not occur.

Therefore, the inventors expected that, also in the case where an oxide semiconductor is used as the semiconductor layer 140, characteristic variation would be suppressed to a level of no practical problem by providing the channel protecting layer 150 on the upper face 140u of the semiconductor layer 140. However, as previously illustrated in FIG. 6, actually, characteristics varied greatly due to the heat treatment in the thin film transistor 91 of the first comparative example.

In this regard, the inventors carried out experiments on the relationships between the disposition of the channel protecting layer 150 and the semiconductor layer 140, and electrical characteristics.

Figure 8A:
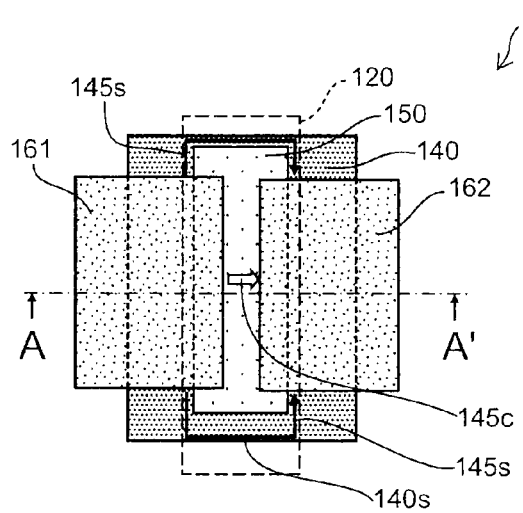
FIGS. 8A to 8D are schematic views illustrating the configuration of the thin film transistor used for the experiments and experimental results.
Figure 8B:
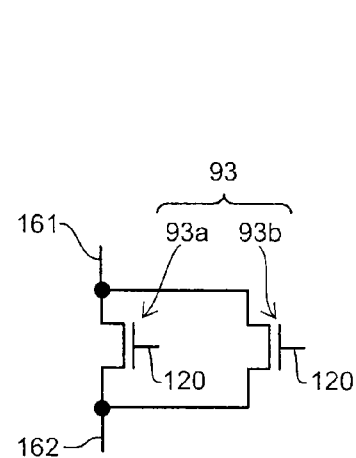
Figure 8C:
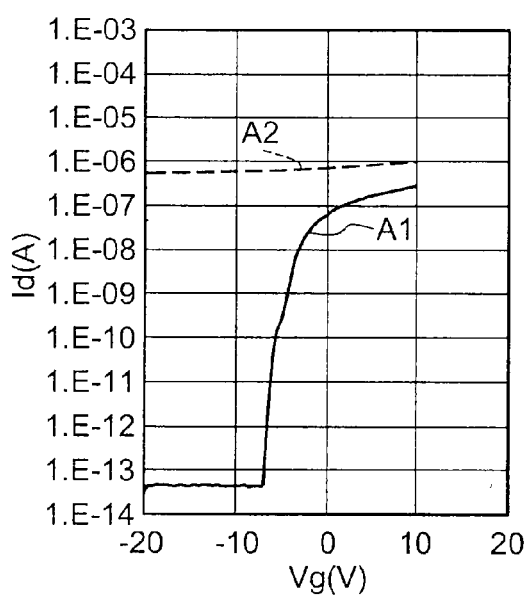
Figure 8D:
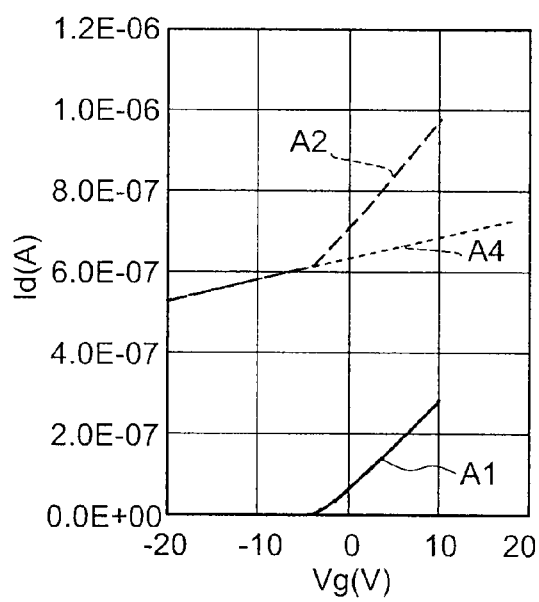

FIGS. 8A to 8D are schematic views illustrating the configuration of the thin film transistor used for the experiments and experimental results. That is, FIG. 8A is a schematic plan view illustrating the configuration of the thin film transistor used for the experiments, FIG. 8B is an equivalent circuit diagram illustrating electrical characteristics of the thin film transistor, and FIGS. 8C and 8D are graphs illustrating results of characteristic measurement when the heat treatment conditions are changed. In FIGS. 8C and 8D, the horizontal axis represents the gate voltage Vg, the vertical axis of FIG. 8C represents the drain current Id on a logarithmic scale, and the vertical axis of FIG. 8D represents the drain current Id on a regular interval scale. In FIG. 8C and FIG. 8D, a solid line A1 illustrates the initial characteristics without the heat treatment and a broken line A2 illustrates the characteristics after the heat treatment of 160° C. under an Ar atmosphere. A dotted line A4 in FIG. 8D illustrates virtual characteristics created by extending the characteristics of the broken line A2 in the region of low gate voltage Vg to the region of high gate voltage Vg.

As illustrated in FIG. 8A, in a thin film transistor 93 used for the experiments, the semiconductor layer 140 has a larger planar shape than the channel protecting layer 150. That is, in the region above the gate electrode 120, the upper face 140u of the semiconductor layer 140 corresponding to the channel region where the source electrode 161 and the drain electrode 162 are opposed to each other is covered with the channel protecting layer 150. However, the upper face 140u of the semiconductor layer 140 other than the channel region and the side face 140s are not covered with the channel protecting layer 150.

The thin film transistor 93 having such a structure showed the characteristics illustrated in FIG. 8C and FIG. 8D.

That is, as illustrated in FIG. 8C, in the thin film transistor 93, a high ON/OFF ratio is obtained in the case of the initial characteristics without the heat treatment (solid line A1). However, in the case of the heat treatment of 160° C. (broken line A2), the ON/OFF ratios are very low, and mostly the ON state is presented (conduction state). That is, the ON/OFF ratios further deteriorate than the characteristics of the heat treatment of 160° C. (broken line A2) of the thin film transistor 91 illustrated in FIG. 6. It is considered that this is because the thin film transistor 93 has a larger area of the semiconductor layer 140 not covered with the channel protecting layer 150 than the thin film transistor 91.

When the characteristics of FIG. 8C are seen on a regular interval scale as illustrated in FIG. 8D, the characteristics of the heat treatment of 160° C. (broken line A2) have a form similar to the initial characteristics without the heat treatment (solid line A1). That is, in both the solid line A1 and the broken line A2, the drain current Id rises rapidly at gate voltages of approximately −4 V or higher. However, in regard to the broken line A2, a large current illustrated with the dotted line A4 flows even when the gate voltage is lower than approximately −4 V, and it was assumed that this current (dotted line A4) and the current rapidly increasing at gate voltages of approximately −4 V or higher would be combined to become the characteristics of the broken line A2.

From these characteristics, it was assumed that the characteristics of the broken line A2 of the thin film transistor 93 after the heat treatment of 160° C. would be characteristics of a configuration in which elements having mutually different characteristics are connected in parallel.

That is, as illustrated in FIG. 8A, it is considered that the characteristics of the broken line A2 are combined characteristics of: the characteristics at a channel section current path 145c that is covered with the channel protecting layer 150 in a region where the source electrode 161 and the drain electrode 162 are opposed to each other; and the characteristics at a surrounding section current path 145s such as the side face 140s of the semiconductor layer 140 not covered with the channel protecting layer 150.

That is, as illustrated in FIG. 8B, the thin film transistor 93 can be regarded as a configuration in which a channel section transistor 93a corresponding to the channel section current path 145c and a surrounding section transistor 93b corresponding to the surrounding section current path 145s are connected in parallel. It is considered that the channel section transistor 93a has the characteristics of the solid line A1 illustrated in FIG. 8D. On the other hand, it is considered that the surrounding section transistor 93b has characteristics similar to the characteristics of the dotted line A4 illustrated in FIG. 8D.

Consequently, it is considered that the broken line A2 presents characteristics resulting from the parallel connection of the channel section transistor 93a and the surrounding section transistor 94b, that is, characteristics resulting from the combination of the solid line A1 and the dotted line A4.

Thus, it was found that characteristics deteriorate due to the heat treatment when the semiconductor layer 140 is not covered with the channel protecting layer 150. Specifically, it is considered that oxygen leaves the exposed portion of the semiconductor layer 140, thereby the resistance of the semiconductor layer 140 decreases, and thus characteristics change.

Therefore, since the channel protecting layer 150 is not provided in the thin film transistor 92 of the second comparative example, the surface of the semiconductor 140 is exposed in a large area of the upper face 140u and the side face 140s of the semiconductor layer 140, and thus characteristics vary greatly due to heat treatment.

Further, in the thin film transistor 91 of the first comparative example, the semiconductor layer 140 is not covered with the channel protecting layer 150 on the side face 140s, and it is assumed that characteristics changed at this portion due to the heat treatment. For example, in the case of the broken line A2 illustrated in FIG. 6, the convex A2a occurs as previously described, and this also suggests that the characteristics of the broken line A2 are characteristics resulting from the parallel connection of the channel section transistor 93a and the surrounding section transistor 93b.

As described above, it was found that, in the configuration of the thin film transistor 91 of the first comparative example illustrated in FIGS. 5A to 5D, though there is no problem in the case where a semiconductor such as amorphous silicon and polysilicon is used as the semiconductor layer 140, there is a problem in the case where an oxide semiconductor of which electrical characteristics greatly depend on the amount of oxygen is used. That is, in the case where an oxide semiconductor is used, if the side face 140s of the semiconductor layer 140 is exposed, the amount of oxygen varies at the portion due to, for example, the heat treatment and consequently characteristics deteriorate significantly. While in conventional thin film transistors using a semiconductor such as amorphous silicon and polysilicon, it has not been necessary to cover the side face 140s as well as the upper face 140u of the semiconductor layer 140 with the channel protecting layer 150 such a configuration is necessary peculiarly for thin film transistors using the semiconductor layer 140 made of an oxide semiconductor.

Here, in the thin film transistor 11 according to this embodiment and the thin film transistor 11a of the first example, the channel protecting layer 150 is a layer provided between the semiconductor layer 140, and the source electrode 161 and the drain electrode 162. The channel protecting layer 150 covers at least part of the upper face 140u of the semiconductor layer 140. Furthermore, at least part of the channel protecting layer 150 is covered with the source electrode 161 and the drain electrode 162.

Since the channel protecting layer 150 is provided in order to protect the semiconductor layer 140, it is formed after forming the semiconductor layer 140. Further, the channel protecting layer 150 is formed before forming the source electrode 161 and the drain electrode 162. As previously described in regard to FIG. 2C to FIG. 3B, this is for the purpose of allowing to perform high temperature annealing at 350° C. for one hour under an air atmosphere and the like, for example, in order to cause the semiconductor layer 140 to recover from damages resulting from film-forming the channel protecting layer 150 on the semiconductor layer 140 by, for example, PE-CVD.

For example, if the semiconductor layer 140 is formed, after that, a film that forms the source electrode 161 and the drain electrode 162 is formed, and subsequently the channel protecting layer 150 is formed, a high temperature treatment for recovery from damages during formation of the channel protecting layer 150 is performed also on the source electrode 161 and the drain electrode 162. If such a high temperature treatment is performed on the source electrode 161 and the drain electrode 162, characteristic deterioration and/or a hillock caused by a reaction between the semiconductor layer 140, and the source electrode 161 and the drain electrode 162 occur as described previously. Thus, this process cannot be employed practically.

Therefore, in the thin film transistor 11 according to this embodiment and the thin film transistor 11a of the first example, the channel protecting layer 150 is provided between the semiconductor layer 140, and the source electrode 161 and the drain electrode 162 in order to enable high temperature treatment for recovery from damages at the time of forming the channel protecting layer 150 on the semiconductor layer 140.

In the thin film transistor 11 according to this embodiment and the thin film transistor 11a of the first example, the channel protecting layer 150 is provided so as to cover the upper face 140u and the side face 140s of the semiconductor layer 140 not covered with the source electrode 161 and the drain electrode 162. However, embodiments of the invention are not limited thereto. That is, it is sufficient that the channel protecting layer 150 is provided so as to cut off at least part of a current path that forms the surrounding section transistor 93*b* described in regard to FIGS. 8A to 8D, and thus various modifications are possible.

FIGS. 9A to 9D are schematic planar views each illustrating the configuration of a thin film transistor of a modification example according to the first embodiment of the invention.

In these drawings, the insulating layer 110 and the gate insulating film 130 are omitted. As illustrated in FIG. 9A, in the thin film transistor 12 of the modification example according to this embodiment, the semiconductor layer 140 includes a region exposed to the outside of the source electrode 161 and the drain electrode 162. However, end portions of the semiconductor layer 140 in the channel direction (gate length direction) of the channel region where the source electrode 161 and the drain electrode 162 are opposed to each other are covered with the channel protecting layer 150.

That is, in this case, the side face 140*s* of the semiconductor layer 140 which is placed between: an extension line 161*p* of a side of the source electrode 161 opposed to the drain electrode 162; and an extension line 162*p* of a side of the drain electrode 162 opposed to the source electrode 161 is covered with the channel protecting layer 150. Accordingly, in a vicinity region 146*s* of the side face 140*s* between the extension line 161*p* and the extension line 162*p*, the side face 140*s* is high resistive with no affect by the heat treatment.

Therefore, the surrounding section current path 145*s* is cut off in the vicinity region 146*s* of the side face 140*s* between the extension line 161*p* and the extension line 162*p*. Thereby, even if a heat treatment for formation of the passivation film and the like is performed, the thin film transistor 12 provides a thin film transistor using an oxide semiconductor which suppresses variation in oxide concentration caused by the heat treatment to suppress characteristic variation.

Further, as illustrated in FIG. 9B, in a thin film transistor 13 of another modification example according to this embodiment, the semiconductor layer 140 includes a region exposed to the outside of the source electrode 161 and the drain electrode 162. Further, the semiconductor layer 140 includes a concave which pulls back to the inside in a region that is placed between: the extension line 161*p* of a side of the source electrode 161 opposed to the drain electrode 162; and the extension line 162*p* of a side of the drain electrode 162 opposed to the source electrode 161. Also in this case, end portions of the semiconductor layer 140 in the channel direction (gate length direction) in the channel region where the source electrode 161 and the drain electrode 162 are opposed to each other are covered with the channel protecting layer 150.

That is, also in this case, the side face 140*s* of the semiconductor layer 140 which is placed between: the extension line 161*p* of a side of the source electrode 161 opposed to the drain electrode 162; and the extension line 162*p* of a side of the drain electrode 162 opposed to the source electrode 161 is covered with the channel protecting layer 150.

Therefore, in the vicinity region 146*s* of the side face 140*s* between the extension line 161*p* and the extension line 162*p*, the side face 140*s* is high resistive with no affect by the heat treatment. Accordingly, the surrounding section current path 145*s* is cut off in the vicinity region 146*s* of the side face 140*s* between the extension line 161*p* and the extension line 162*p*. Thereby, even if a heat treatment for formation of the passivation film and the like is performed, the thin film transistor 13 provides a thin film transistor using an oxide semiconductor which suppresses variation in oxide concentration caused by heat treatment to suppress characteristic variation.

Thus, it is sufficient that the channel protecting layer 150 is provided so as to cover the side face 140*s* and the upper face 140*u* of the semiconductor layer 140 which are placed between: the extension line 161*p* of a side of the source electrode 161 opposed to the drain electrode 162; and the extension line 162*p* of a side of the drain electrode 162 opposed to the source electrode 161. Thereby, the surrounding section current path 145*s* is substantially cut off in the vicinity region 146*s* of the side face 140*s* between the extension line 161*p* and the extension line 162*p*. Therefore, even if there is a portion where the side face 140*s* and/or the upper face 140*u* of the semiconductor layer 140 are not covered with the source electrode 161 and the drain electrode 162, the thin film transistor 13 is substantially not affected by characteristic variation of the semiconductor layer 140 due to the heat treatment because the surrounding section current path 145*s* is cut off.

Further, as illustrated in FIG. 9C, also in a thin film transistor 13*a* of another modification example according to this embodiment, the semiconductor layer 140 includes a region exposed to the outside of the source electrode 161 and the drain electrode 162. Further, part of the side face 140*s* of the semiconductor layer 140 is covered with the channel protecting layer 150 in a region that is placed above the gate electrode 120 and between: the extension line 161*p* of a side of the source electrode 161 opposed to the drain electrode 162; and the extension line 162*p* of a side of the drain electrode 162 opposed to the source electrode 161. That is, also in this case, part of end portions of the semiconductor layer 140 in the channel direction (gate length direction) of the channel region where the source electrode 161 and the drain electrode 162 are opposed to each other are covered with the channel protecting layer 150.

Thereby, the surrounding section current path 145*s* is substantially cut off at part of the side face 140*s* between the extension line 161*p* and the extension line 162*p*. Therefore, even if there is a portion where the side face 140*s* and/or the upper face 140*u* of the semiconductor layer 140 are not covered with the source electrode 161 and the drain electrode 162, the thin film transistor 13*a* is substantially not affected by characteristic variation of the semiconductor layer 140 due to the heat treatment because the surrounding section current path 145*s* is cut off.

Thus, it is sufficient that the channel protecting layer 150 is provided on at least part of the side face 140*s* of the semiconductor layer 140 so as to cut off the surrounding section current path 145*s* of the semiconductor layer 140.

In the configurations illustrated in FIGS. 9A, 9B and 9C, regions where the semiconductor layer 140 is not covered with the source electrode 161 and the drain electrode 162 and spreads from the area corresponding to them may be etching-removed by using the source electrode 161, the drain electrode 162, and the channel protecting layer 150 as a mask.

Further, as illustrated in FIG. 9D, in a thin film transistor 14 of another modification example according to this embodiment, the channel protecting layer 150 is not formed in an island shape but provided with a large area so as to cover the entire semiconductor layer 140, and openings 161*q* and 162*q* are provided in the channel protecting layer 150 at portions where the semiconductor layer 140 contacts the source electrode 161 and the drain electrode 162.

Thereby, in the thin film transistor 14, only the channel section transistor 93*a* corresponding to the channel section current path 145*c* of the channel region where the source electrode 161 and the drain electrode 162 are opposed to each other is formed, but the surrounding section transistor 93*b* corresponding to the surrounding section current path 145*s* is not formed. Thereby, even if a heat treatment for formation of the passivation film and the like is performed, the thin film transistor 14 provides a thin film transistor using an oxide semiconductor which suppresses variation in oxygen concentration caused by heat treatment to suppress characteristic variation.

Also in this case, the side face 140s and the upper face 140u of the semiconductor layer 140 which are placed between: the extension line 161p of a side of the source electrode 161 opposed to the drain electrode 162; and the extension line 162p of a side of the drain electrode 162 opposed to the source electrode 161 are covered with the channel protecting layer 150.

Thus, the channel protecting layer 150 further covers the upper face 140u of the semiconductor layer 140 between the extension line 161p of a side of the source electrode 161 opposed to the drain electrode 162 and the extension line 162p of a side of the drain electrode 162 opposed to the source electrode 161.

SECOND EXAMPLE

A thin film transistor 15 according to a second example of the invention has a configuration similar to the thin film transistor 11a described in regard to FIGS. 2A to 2C and FIGS. 3A and 3B. However, it is fabricated by a manufacturing method different from that for the thin film transistor 11a. That is, photolithography for patterning the channel protecting layer 150 and photolithography for patterning a portion for extracting the gate electrode 120 are simultaneously performed, which reduces the number of processes. A method for manufacturing a thin film transistor according to this example will now be described.

FIGS. 10A to 10D are sequential schematic cross-sectional views illustrating a method for manufacturing a thin film transistor according to the second example of the invention.

The drawings are cross-sectional views corresponding to the cross-section taken along line A-A' of FIG. 1A. Also in these drawings, a contact unit is illustrated in addition to the portion of the thin film transistor.

Figure 10A:
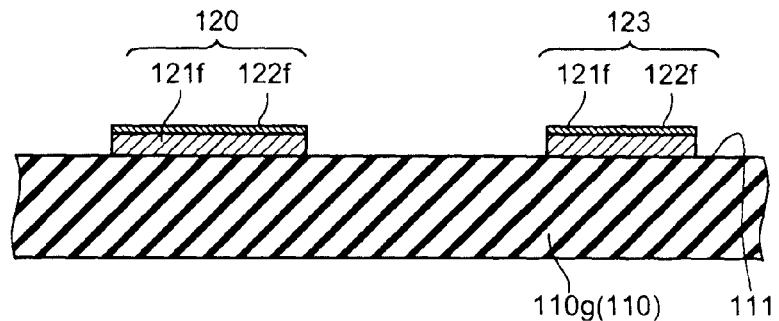
FIGS. 10A to 10D are sequential schematic cross-sectional views illustrating a method for manufacturing a thin film transistor according to a second example of the invention.

First, as illustrated in FIG. 10A, the Al film 121f and the Mo film 122f were film-formed with thicknesses of 100 nm and 30 nm, respectively, on the major face 111 of the glass substrate 110g that is the insulating layer 110 by sputtering, and then were patterned into a prescribed pattern to form the gate electrode 120. Photolithography was used for the patterning, and a mixed acid of phosphoric acid, acetic acid, nitric acid, and water was used for the etching. At this time, the contact unit 123 of the gate electrode 120 of the thin film transistor was also formed simultaneously. The contact unit 123 is also formed of stacked films of the Al film 121f and the Mo film 122f.

Figure 10B:
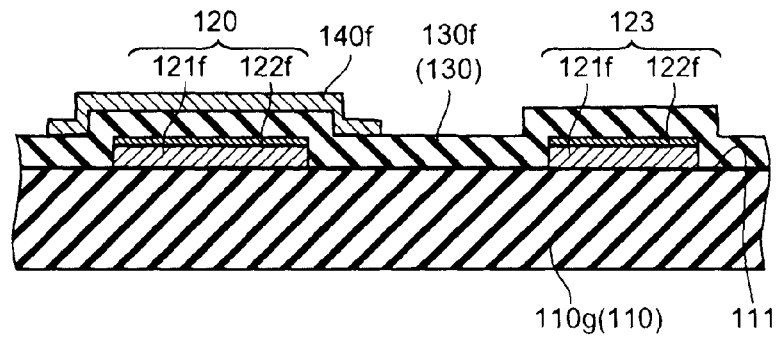

Next, as illustrated in FIG. 10B, the $SiO_2$ film 130f was deposited with a thickness of 200 nm as the gate insulating film 130 by PE-CVD using TEOS as raw material. At this time, the film-formation temperature was 350° C.

Further, on the gate insulating film 130, the oxide layer 140f made of In—Ga—Zn—O oxide which forms the semiconductor layer 140 was film-formed with a thickness of 30 nm by reactive DC sputtering. At this time, the ratio of oxygen was 5% to argon. Then, the oxide layer 140f was patterned into a prescribed pattern across the gate electrode 120 by using oxalic acid of 2%, and thus the semiconductor layer 140 was formed.

Figure 10C:
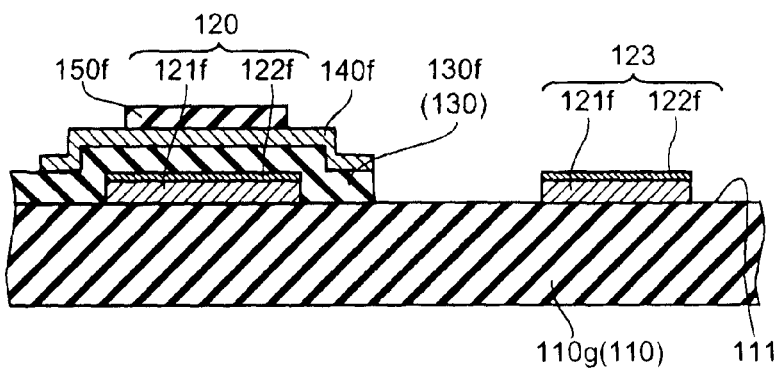

Further, as illustrated in FIG. 10C, the $SiO_2$ film 150f that forms the channel protecting layer 150 was deposited with a thickness of 200 nm by PE-CVD of TEOS. At this time, the film-formation gas was a mixed gas of $O_2$ and TEOS, and the film-formation temperature was 350° C. After that, the $SiO_2$ film 150f was patterned into a prescribed pattern covering the side face 140s and the upper face 140u of the semiconductor layer 140 except regions that form later the source contact region 141 and the drain contact region 142, and thus the channel protecting layer 150 was formed.

The mask exposure and back face exposure using the gate electrode 120 as a mask were performed in combination for photolithography at the time of patterning of the $SiO_2$ film 150f. The etching at this time was performed by RIE using $CF_4$ gas.

At this time, after removing the $SiO_2$ film 150f of the channel protecting layer 150 deposited on the contact unit 123, the $SiO_2$ film 130f of the gate insulating film 130 was removed to expose the stacked films of the Al film 121f and the Mo film 122f of the contact unit 123.

After that, annealing was performed at 350° C. for one hour under an air atmosphere to remove damages in the semiconductor layer 140 due to the PE-CVD process for film-formation of the $SiO_2$ film 150f.

Figure 10D:
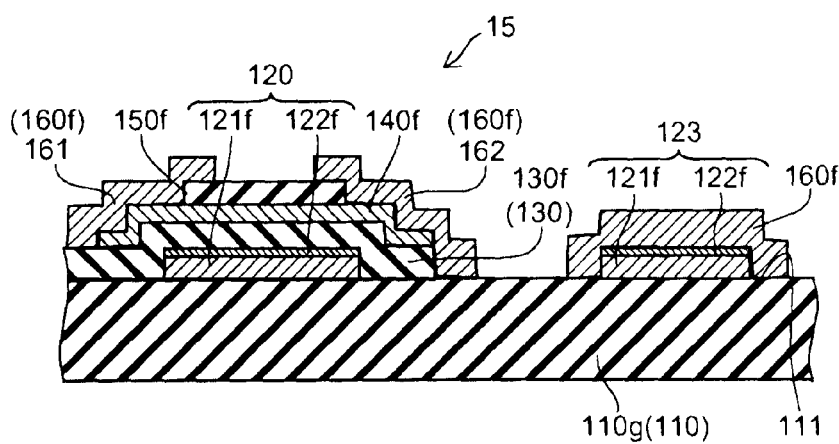

Then, as illustrated in FIG. 10D, the Mo film 166, the Al film 167, and the Mo film 168 that form the source electrode 161 and the drain electrode 162 were film-formed with thicknesses of 10 nm, 300 nm, and 50 nm, respectively, by sputtering to form the stacked films 160f, and the stacked films 160f were patterned into a prescribed pattern by using a mixed acid to form the source electrode 161 and the drain electrode 162. Thereby, the configuration of the thin film transistor 11a is completed. Further, the stacked films 160f of the Mo film 166, the Al film 167, and the Mo film 168 are provided on the stacked films of the Al film 121f and the Mo film 122f that form the contact unit 123, and thus the contact unit 123 is formed.

After that, in order to remove element damages during the processes, annealing is performed in a clean oven at 230° C. for approximately one hour. Thus, the thin film transistor 15 according to this example is obtained.

Thus, by performing patterning of the channel protecting layer 150 and patterning of the contact unit 123 for extracting the gate electrode 120 by the same process of photolithography, processes for patterning of the contact hole 123h illustrated in FIG. 3A can be omitted, and the manufacturing becomes easier. The thin film transistor 15 manufactured by such a method also provides a thin film transistor using an oxide semiconductor which suppresses variation in oxygen concentration caused by the heat treatment to suppress characteristic variation.

THIRD EXAMPLE

A thin film transistor according to a third example of the invention is a modification to the thin film transistor 11a according to the first example. It can shorten channel length to improve current driving capability of transistor, and reduce characteristic deterioration due to a reaction between the source electrode 161 and the drain electrode 162, and the channel.

Figure 11A:
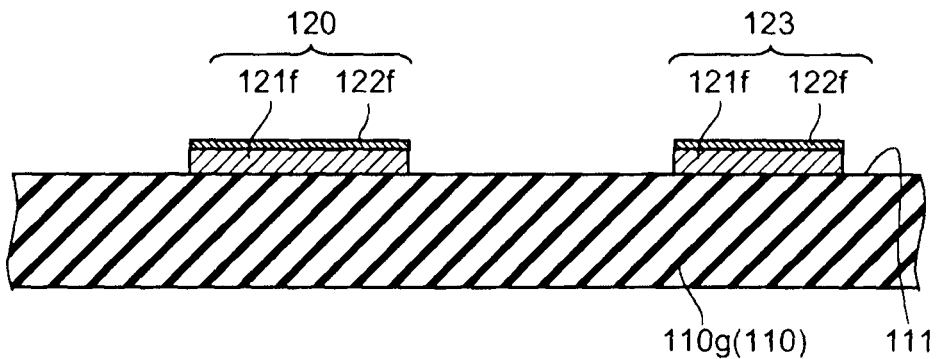
FIGS. 11A to 11C are sequential schematic cross-sectional views illustrating a method for manufacturing a thin film transistor according to a third example of the invention.
Figure 11B:
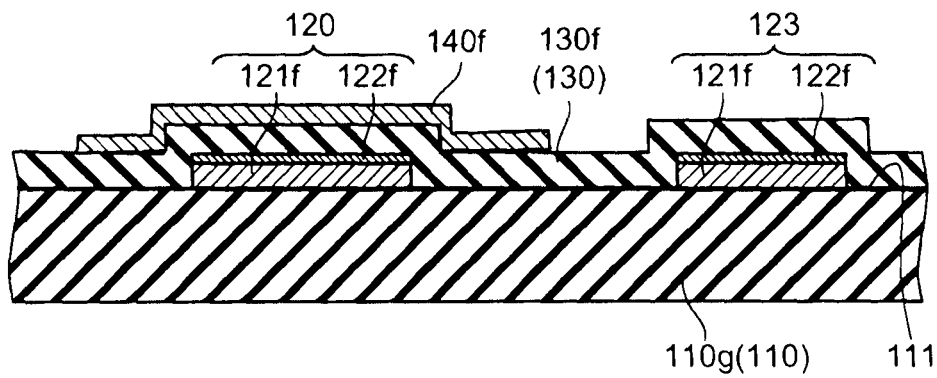
Figure 11C:
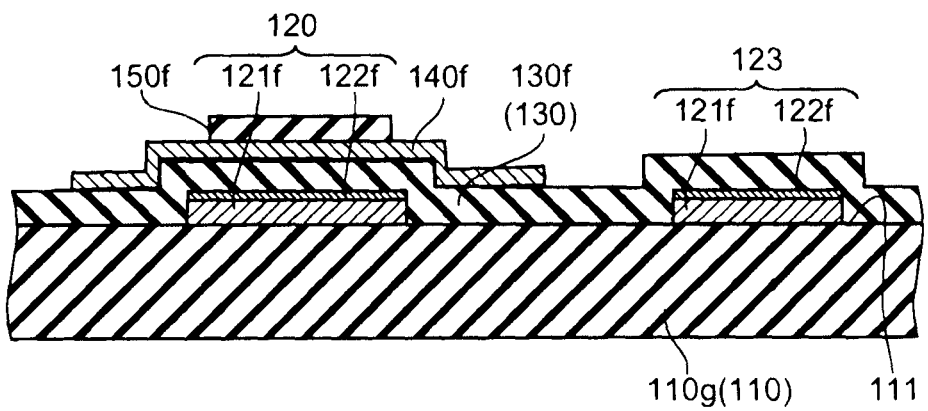

FIGS. 11A to 11C are sequential schematic cross-sectional views illustrating a method for manufacturing a thin film transistor according to the third example of the invention.

Figure 12A:
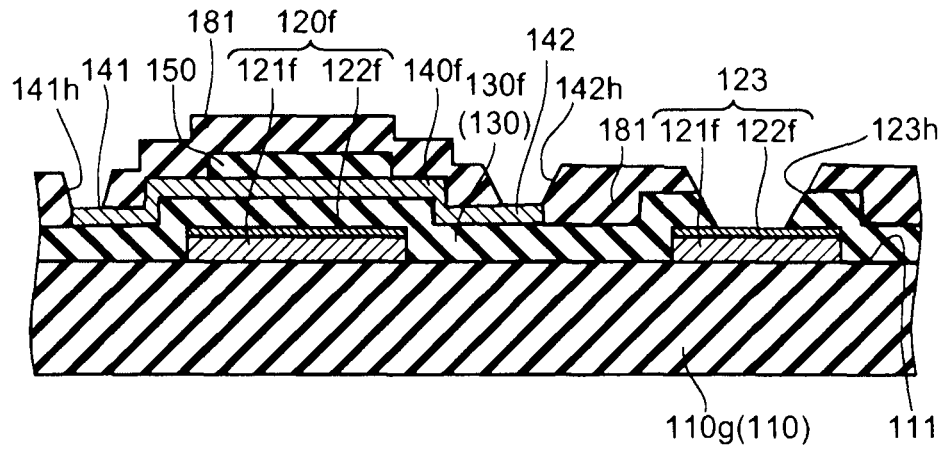
FIGS. 12A and 12B are sequential schematic cross-sectional views continuing from FIG. 11C.
Figure 12B:
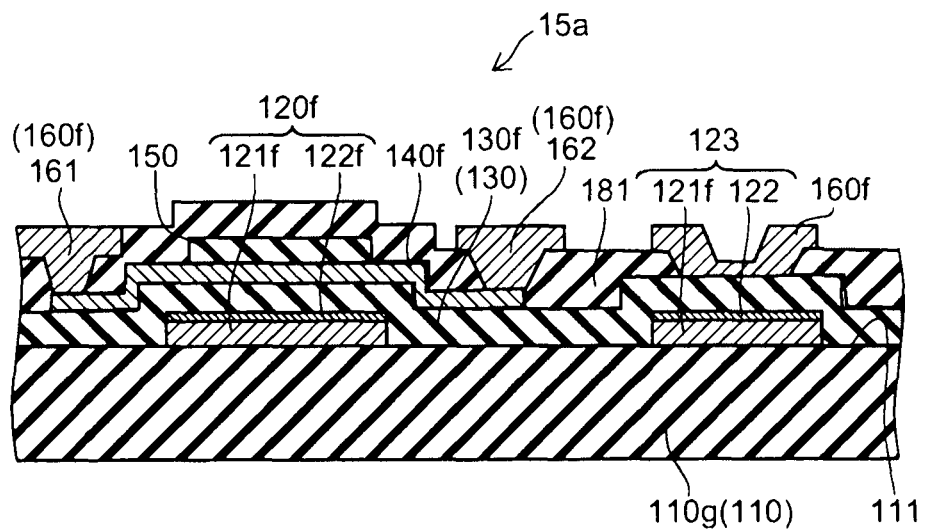

FIGS. 12A and 12B are sequential schematic cross-sectional views continuing from FIG. 11C.

These drawings are cross-sectional views corresponding to the cross-section taken along line A-A' of FIG. 1A. Also in these drawings, a contact unit is illustrated in addition to the portion of the thin film transistor.

First, as illustrated in FIG. 11A, the Al film 121f and the Mo film 122f were film-formed with thicknesses of 100 nm and 30 nm, respectively, on the major face 111 of the glass substrate 110g that is the insulating layer 110 by sputtering, and then were patterned into a prescribed pattern to form the gate electrode 120. Photolithography was used for the patterning, and a mixed acid of phosphoric acid, acetic acid, nitric acid, and water was used for the etching. At this time, the contact unit 123 of the gate electrode 120 of the thin film transistor was also formed simultaneously. The contact unit 123 is also formed of stacked films of the Al film 121f and the Mo film 122f.

Next, as illustrated in FIG. 11B, the $SiO_2$ film 130f was deposited with a thickness of 200 nm as the gate insulating film 130 by PE-CVD using TEOS as raw material. At this time, the film-formation temperature was 350° C.

Further, on the gate insulating film 130, the oxide layer 140f made of In—Ga—Zn—O oxide which forms the semiconductor layer 140 was film-formed with a thickness of 30 nm by reactive DC sputtering. At this time, the ratio of oxygen was 5% to argon. Then, the oxide layer 140f was patterned into a prescribed pattern going across the gate electrode 120 by using oxalic acid of 2%, and thus the semiconductor layer 140 was formed.

Further, as illustrated in FIG. 11C, the $SiO_2$ film 150f that forms the channel protecting layer 150 was deposited with a thickness of 200 nm by PE-CVD of TEOS. At this time, the film-formation gas was a mixed gas of $O_2$ and TEOS, and the film-formation temperature was 350° C. After that, this $SiO_2$ film 150f was patterned into a prescribed pattern covering the side face 140s and the upper face 140u of the semiconductor layer 140 except regions that form later the source contact region 141 and the drain contact region 142, and thus the channel protecting layer 150 was formed.

Mask exposure and back face exposure using the gate electrode 120 as a mask were performed in combination for photolithography at the time of patterning of the $SiO_2$ film 150f. The etching at this time was performed by RIE using $CF_4$ gas.

After that, annealing was performed at 350° C. for one hour under an air atmosphere to remove damages in the semiconductor layer 140 due to the PE-CVD process for film-formation of the $SiO_2$ film 150f.

Next, as illustrated in FIG. 12A, a SiN film that forms a passivation film 181 was deposited by PE-CVD. The film-formation temperature was 250° C.

Then, contact holes 141h and 142h were formed at positions corresponding to the source contact region 141 and the drain contact region 142, respectively. At this time, the contact hole 123h for extracting the gate electrode 120 was also formed simultaneously.

Then, as illustrated in FIG. 12B, the Mo film 166, the Al film 167, and the Mo film 168 that form the source electrode 161 and the drain electrode 162 were film-formed with thicknesses of 10 nm, 300 nm, and 50 nm, respectively, by sputtering to form the stacked films 160f, and the stacked films 160f were patterned into a prescribed pattern by using a mixed acid to form the source electrode 161 and the drain electrode 162. Thereby, the configuration of the thin film transistor 15a is completed. Further, the stacked films 160f of the Mo film 166, the Al film 167, and the Mo film 168 are provided on the stacked films of the Al film 121f and the Mo film 122f that form the contact unit 123, and thus the contact unit 123 is formed.

Thus, the thin film transistor 15a according to this example is formed.

In the above, by the heating of 160° C. or higher during film-formation of the SiN film that forms the passivation film 181, oxygen leaves the oxide layer 140f that is not covered with the channel protecting layer 150, covered with the SiN layer, i.e., the passivation film 181, and made of In—Ga—Zn—O oxide. Therefore, the oxide layer 140f becomes low resistive. Since this portion is low resistive even when the SiN film is etching-removed, the serial resistance between the source electrode 161 and the drain electrode 162, and the channel section can be kept low. The channel section is protected by the channel protecting layer 150 that is formed of the $SiO_2$ film 150f containing oxygen, and thus oxygen does not leaves the oxide layer 140f at this portion, where high resistance can be maintained.

(Second Embodiment)

Figure 13:
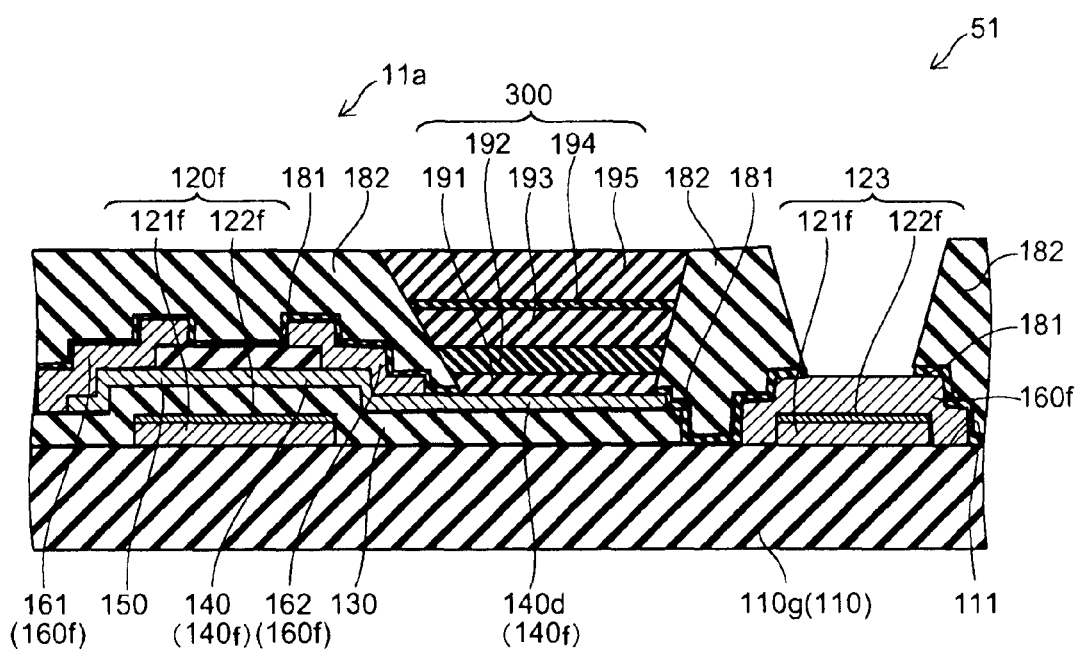
FIG. 13 is a schematic cross-sectional view illustrating the configuration of a display device according to a second embodiment of the invention.

FIG. 13 is a schematic cross-sectional view illustrating the configuration of a display device according to a second embodiment of the invention.

The portion of the thin film transistor illustrated in the drawing is illustrated as a cross-section corresponding to the cross-section taken along line A-A' of FIG. 1A.

As illustrated in FIG. 13, a display device 51 according to the second embodiment of the invention includes: the thin film transistor 11a according to the first example of the first embodiment; a pixel electrode 140d connected to the drain electrode 162 of the thin film transistor 11a; and an optical element 300 that produces at least one of a change in optical characteristics and light emitting by an electric signal provided to the pixel electrode 140d.

Although the thin film transistor 11a is used in this specific example, any of the thin film transistors 11, 11a, 12, 13, 13a, 14, 15, and 15a of specific examples according to the first embodiment may be used.

The pixel electrode 140d is made of oxide that forms the semiconductor layer 140 of the thin film transistor 11a, and has lower electric resistance than the semiconductor layer 140. That is, the pixel electrode 140d is formed by the oxide layer 140f that forms the semiconductor layer 140, and the pixel electrode 140d and the semiconductor layer 140 are the same layer. A lower resistance value is required at the portion of the pixel electrode 140d than at the semiconductor layer 140. Accordingly, as described below, a scheme is used by which the oxide layer 140f used for the semiconductor layer 140 becomes low resistive at the portion of the pixel electrode 140d.

Further, in this example, an organic EL element is used as the optical element 300. That is, a Cu phthalocyanine layer 191 with a thickness of 25 nm that forms a hole injecting layer, an α-NPD (N,N'—di(1-naphthyl)-N,N'-diphenylbenzidine) layer 192 with a thickness of 35 nm that forms a hole carrying layer, an Alq3 (tris(8-hydroxyquinoline)aluminum) layer 193 with a thickness of 50 nm that forms a light emitting layer, a LiF layer 194 with a thickness of 0.6 nm, and an Al layer 195 with a thickness of 150 nm that forms a cathode are provided in sequence on the pixel electrode 140d to form an organic EL layer. That is, in this example, the optical element 300 emits light by an electric signal provided to the pixel electrode 140d. Liquid crystal or the like that produces a change in optical characteristics such as birefringence, optical activity, scattering, and absorption by an electric signal provided to the pixel electrode 140d also may be used as the optical element 300.

Although glass sealing is further performed on the structure illustrated in FIG. 13 to obtain a display panel with high reliability, it is omitted here.

Since the display device 51 according to this embodiment uses any of the thin film transistors according to the first embodiment of the invention, even if a heat treatment for formation of the passivation film and the like after forming the thin film transistor is performed, it can provide a display device using a thin film transistor that uses an oxide semiconductor and suppresses characteristic variation due to the heat treatment.

Furthermore, since the oxide layer 140f used for the semiconductor layer 140 can be used to form the pixel electrode 140d, the number of processes for formation of the pixel electrode 140d does not increase and this configuration can provide high productivity.

That is, the semiconductor layer 140 that forms the channel of the thin film transistor 11a is covered with the channel protecting layer 150, and oxygen hardly leaves at this portion of the oxide layer 140f. In contrast, since the oxide layer 140f that forms the pixel electrode 140d is not covered with the channel protecting layer 150, oxygen leaves easily by the heat treatment at this portion. By using this configuration, the oxide layer 140f that forms the pixel electrode 140d can be made low resistive selectively, while the oxide layer 140f having the same material as the semiconductor layer 140 that forms the channel of the thin film transistor 11a is used for the pixel electrode 140d.

Thus, the concentration of oxygen contained in the pixel electrode 140d is lower than the concentration of oxygen contained in the semiconductor layer 140, and thereby the electric resistance of the pixel electrode 140d is made lower than the semiconductor layer 140.

FOURTH EXAMPLE

A method for manufacturing a display device according to this embodiment will now be described as a fourth example.

Figure 14A:
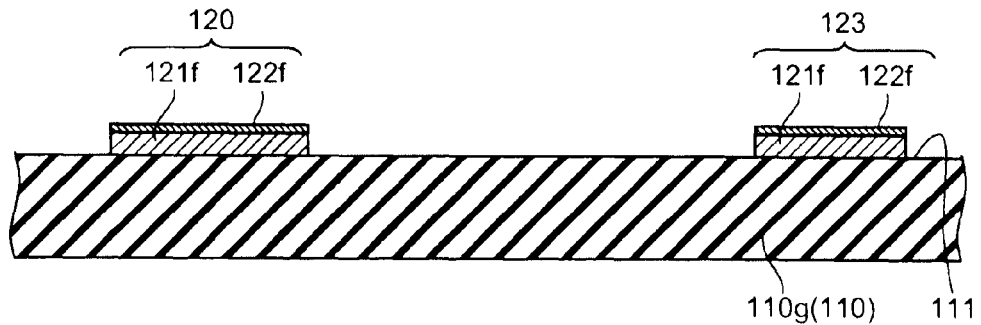
FIGS. 14A to 14C are sequential schematic cross-sectional views illustrating a method for manufacturing a display device according to a fourth example of the invention.
Figure 14B:
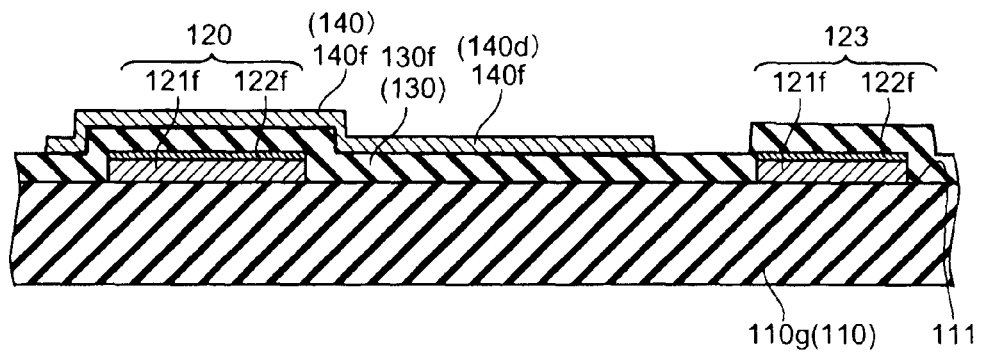
Figure 14C:
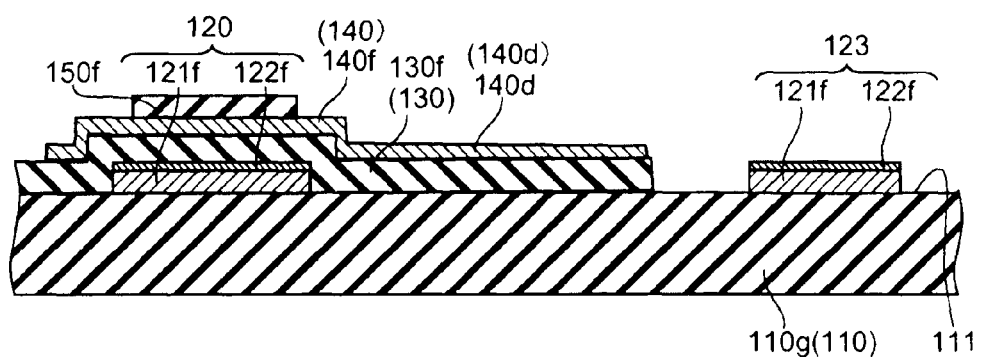

FIGS. 14A to 14C are sequential schematic cross-sectional views illustrating a method for manufacturing a display device according to the fourth example of the invention.

Figure 15A:
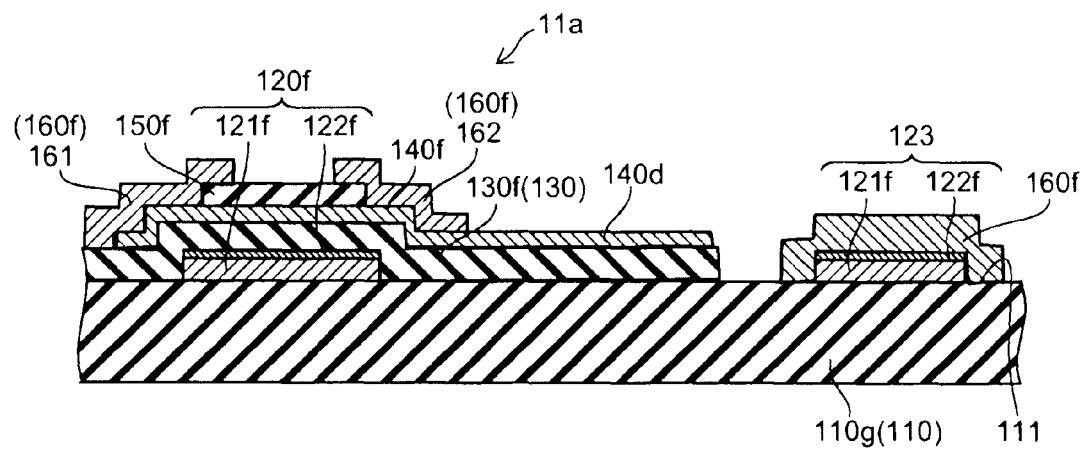
FIGS. 15A and 15B are sequential schematic cross-sectional views continuing from FIG. 14C.
Figure 15B:
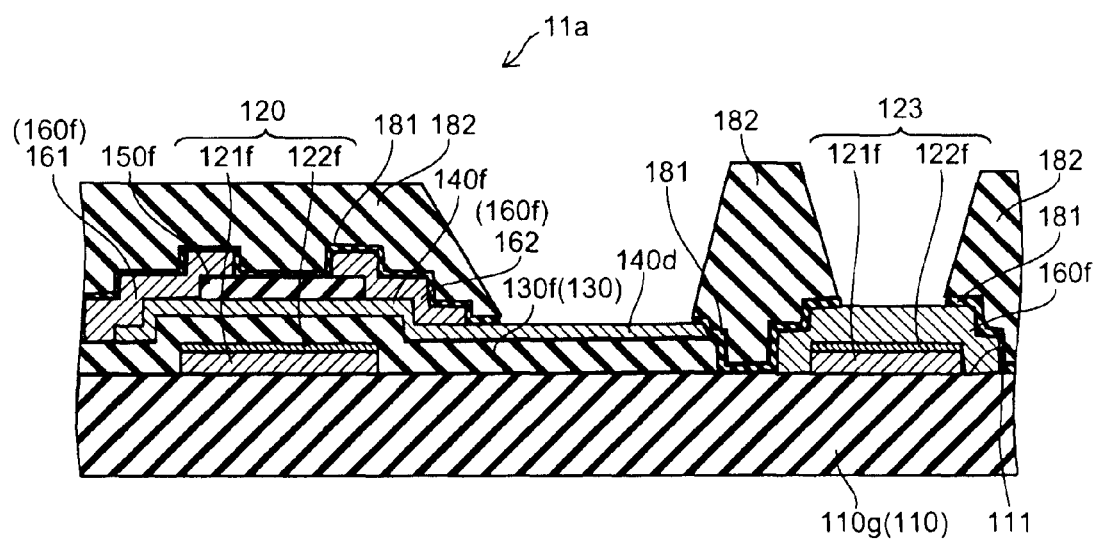

FIGS. 15A and 15B are sequential schematic cross-sectional views continuing from FIG. 14C.

Also in these drawings, a portion of the thin film transistor is illustrated as a cross-section corresponding to the cross-section taken along line A-A' of FIG. 1A.

As illustrated in FIG. 14A, first, the Al film 121f and the Mo film 122f were film-formed with thicknesses of 100 nm and 30 nm, respectively, on the major face 111 of the glass substrate 110g that is the insulating layer 110 by sputtering, and were patterned into a prescribed pattern to form the gate electrode 120. Photolithography was used for the patterning, and a mixed acid of phosphoric acid, acetic acid, nitric acid, and water was used for the etching. At this time, the contact unit 123 of the gate electrode 120 of the thin film transistor was also formed simultaneously. The contact unit 123 is also formed of stacked films of the Al film 121f and the Mo film 122f.

Next, as illustrated in FIG. 14B, the $SiO_2$ film 130f was deposited with a thickness of 200 nm as the gate insulating film 130 by PE-CVD using TEOS as raw material. At this time, the film-formation temperature was 350° C.

Further, on the $SiO_2$ film 130f, an In—Ga—Zn—O oxide film was film-formed with a thickness of 30 nm as the oxide layer 140f that forms the semiconductor layer 140 and the pixel electrode 140d by reactive DC sputtering. At this time, the ratio of oxygen was 5% to argon. Then, the oxide layer 140f was patterned into a shape that connects the pixel electrode 140d and a prescribed channel pattern across the gate electrode 120 by using oxalic acid of 2%, and thus the shapes of the semiconductor layer 140 and the pixel electrode 140d were formed.

Further, as illustrated in FIG. 14C, the $SiO_2$ film 150f that forms the channel protecting layer 150 was deposited with a thickness of 200 nm by PE-CVD using TEOS. At this time, the film-formation gas was a mixed gas of $O_2$ and TEOS, and the film-formation temperature was 350° C. After that, annealing was performed at 350° C. for one hour under an air atmosphere to remove damages in the oxide layer 140f due to the PE-CVD process at the time of formation of the $SiO_2$ film 150f.

After that, the $SiO_2$ film 150f was patterned into a prescribed pattern covering the side face 140s and the upper face 140u of the semiconductor layer 140 except regions that form later the source contact region 141 and the drain contact region 142, and thus the channel protecting layer 150 was formed. At this time, the $SiO_2$ film 150f on the pixel electrode 140d was etched to be removed to expose the oxide layer 140f that forms the pixel electrode 140d from the channel protecting layer 150.

At this time, the etching of the $SiO_2$ film 150f was performed by RIE using $CF_4$. Continuing the etching of the $SiO_2$ film 150f, the $SiO_2$ film 130f that forms the gate insulating film 130 was etched until the Al film 121f and the Mo film 122f that form the contact unit 123 of the gate electrode 120 are exposed by using the semiconductor layer 140 and the resist for shape-patterning the channel protecting layer 150 as a mask,.

Then, as illustrated in FIG. 15A, the Mo film 166, the Al film 167, and the Mo film 168 that form the source electrode 161 and the drain electrode 162 were film-formed with thicknesses of 10 nm, 300 nm, and 50 nm, respectively, by sputtering to form the stacked films 160f. After that, the stacked films 160f were patterned into a prescribed pattern by using a mixed acid to form the source electrode 161 and the drain electrode 162. Thereby, the thin film transistor 11a and the contact unit 123 are completed.

After that, as illustrated in FIG. 15B, a SiN film that forms the passivation film 181 was deposited with a thickness of 100 nm by PE-CVD. Using a temperature of approximately 230° C. for film-formation of the SiN film can provide the passivation film 181 with sufficient barrier properties.

Further, banks 182 having a prescribed shape excluding the pixel electrode 140d and the contact unit 123 were formed by using a photosensitive transparent resin. Photosensitive acrylic or photosensitive polyimide may be used as the photosensitive transparent resin. The heating temperature is 230° C., for example. After forming the bank 182, the SiN film, i.e., the passivation film 181 was etched to be removed by using the bank 182 as a mask.

After that, a light emitting unit of an organic EL was formed between banks 182. That is, the Cu phthalocyanine layer 191 with a thickness of 25 nm that forms a hole injecting layer, the α-NPD layer 192 with a thickness of 35 nm that forms a hole carrying layer, the Alq3 layer 193 with a thickness of 50 nm that forms a light emitting layer, the LiF layer 194 with a thickness of 0.6 nm, and the Al layer 195 with a thickness of 150 nm that forms a cathode layer were film-formed by using a deposition apparatus.

Thus, the display device 51 illustrated in FIG. 13 is fabricated.

Here, on a portion of the oxide layer 140f which forms the pixel electrode 140d, the SiN film is formed at a film-formation temperature of 230° C., and thereby oxygen leaves the oxide layer 140f at a portion of the oxide layer 140f which forms the pixel electrode 140d to make the portion low resistive. On the other hand, the oxide layer 140f above the gate electrode 120 which forms the semiconductor layer 140 is covered with the channel protecting layer 150 made of the $SiO_2$ film 150f containing oxygen, and therefore is not made low resistive even by the heating of 230° C. which is the film-formation temperature for the SiN film. Further, also in the heat treatment during subsequent formation of the bank 182, oxygen further leaves the pixel electrode 140d at the portion of the pixel electrode 140d in the oxide layer 140f to make the portion further lower resistive. On the other hand, high resistance is maintained at the oxide layer 140f above the gate electrode 120 which forms the semiconductor layer 140.

Thus, in the display device 51 and the method for manufacturing the same according to this embodiment, the same material (the oxide layer 140f) as the material of the semiconductor layer 140 that forms the channel of the thin film transistor 11a is used for the pixel electrode 140d. While the oxide layer 140f that forms the semiconductor layer 140 of the channel section is covered with the channel protecting layer 150 containing oxide, the oxide layer 140f that forms the pixel electrode 140d is not covered with the channel protecting layer 150 and covered with, for example, a SiN film. Thereby, the oxide layer 140f that forms the pixel electrode 140d is made low resistive selectively.

Thus, the display device 51 and the method for manufacturing the same according to this embodiment can omit processes for formation of another film for formation of the pixel electrode 140d, and provide a display device using an oxide semiconductor which suppresses characteristic variation due to the heat treatment and a method for manufacturing the same.

FIFTH EXAMPLE

A display device 52 (not illustrated) according to a fifth example of the invention makes the resistance different between the semiconductor layer 140 and the pixel electrode 140d by controlling the film structure of the oxide layer 140f that forms the semiconductor layer 140.

That is, on a basis of the experiments of the inventors, it was found that the electric resistance at an oxide semiconductor layer depends on the film structure of the oxide semiconductor layer, as well as on the concentration of oxygen contained in the oxide semiconductor layer. The film structure of the oxide semiconductor layer changes with, for example, the smoothness of the surface of the under layer at the time of film-forming the oxide semiconductor layer.

For example, in the case where the surface of the gate insulating film 130 that forms the under layer of the semiconductor layer 140 is a rough face, the semiconductor layer 140 made of oxide and film-formed on the surface becomes a columnar structure. When the cross-section of the semiconductor layer 140 is observed with a SEM (scanning electron microscope) or TEM (transmission electron microscope), columnar grains having sizes of approximately 10 nm to 30 nm are observed while the semiconductor layer 140 has an amorphous state in crystalline state.

On the other hand, in the case when the surface of the gate insulating film 130 of the under layer is smooth, the semiconductor layer 140 becomes not a columnar structure but a uniform film structure, and no specific grain is observed by the observing method mentioned above.

Although depending on film-formation conditions, it was found that the semiconductor layer 140 presents the columnar structure when the surface roughness (unevenness) of the gate insulating film 130 that is the under layer is 10 nm to 5 nm (not less than 5 nanometers and not greater than 10 nanometers), for example. Further, it was found that the semiconductor layer 140 presents a uniform film structure when the surface roughness of the gate insulating film 130 is smooth and 1 nm to 0.1 nm (not less than 0.1 nanometers and not greater than 1 nanometer), for example. The grain size in the case of the columnar structure is 10 nm to 30 nm, for example.

The electric resistance in the columnar structure having large grain sizes is relatively lower than the electric resistance in the uniform film structure. That is, the resistivity of the semiconductor layer 140 depends on the morphology of the under layer of the semiconductor layer 140. If the film structure of the semiconductor layer 140 is the columnar structure and has a large grain size, the resistivity is relatively low.

For example, while in the case of the columnar structure, the resistance value is 0.1 to 10 Ωcm, in the case of the uniform film structure, the resistance value can be $1 \times 10^8$ Ωcm or more.

By applying these experimental results, the distribution of electric resistance in the display device 52 according to this embodiment can be controlled by controlling the grain size of the semiconductor layer 140.

FIGS. 16A to 16D are sequential schematic cross-sectional views illustrating a method for manufacturing the display device according to the fifth example of the invention.

Also in these drawings, a portion of the thin film transistor is illustrated as a cross-section corresponding to the cross-section taken along line A-A' of FIG. 1A.

Figure 16A:
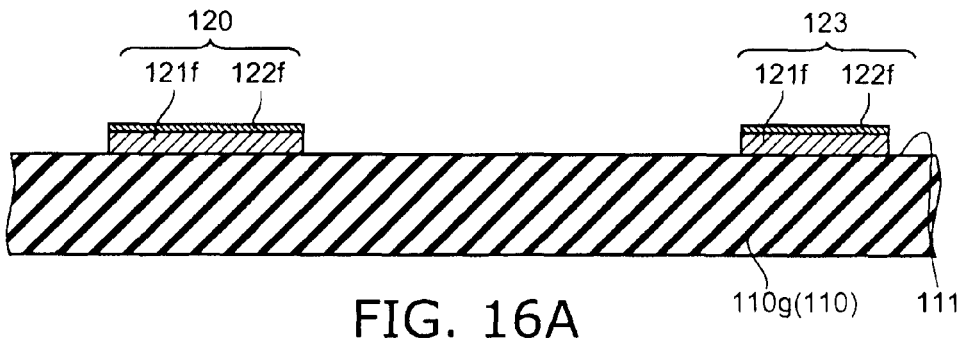
FIGS. 16A to 16D are sequential schematic cross-sectional views illustrating a method for manufacturing a display device according to a fifth example of the invention.

As illustrated in FIG. 16A, first, the Al film 121f and the Mo film 122f were film-formed with thicknesses of 100 nm and 30 nm, respectively, on the major face 111 of the glass substrate 110g that is the insulating layer 110 by sputtering, and were patterned into a prescribed pattern to form the gate electrode 120. Photolithography was used for the patterning, and a mixed acid of phosphoric acid, acetic acid, nitric acid, and water was used for the etching. The contact unit 123 of the gate electrode 120 of the thin film transistor was also formed simultaneously. The contact unit 123 is also formed of stacked films of the Al film 121f and the Mo film 122f.

Figure 16B:
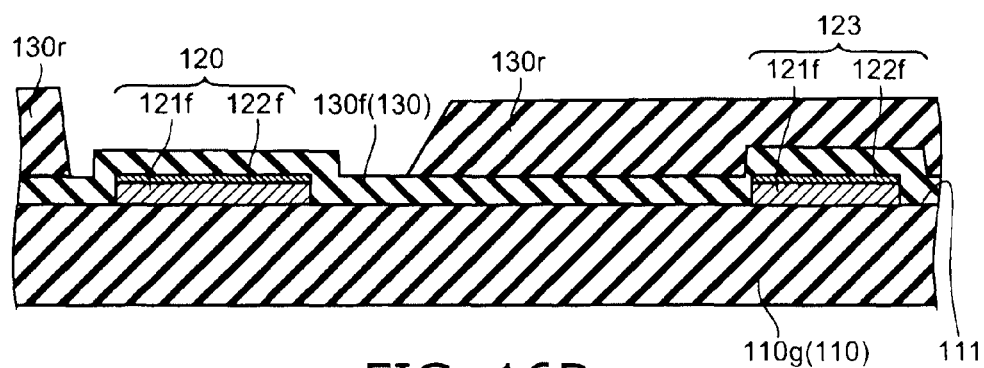

Next, as illustrated in FIG. 16B, the $SiO_2$ film 130f was deposited with a thickness of 200 nm as the gate insulating film 130 by PE-CVD using silane and TEOS as raw material. The film-formation temperature is 350° C.

After that, a resist 130r in which only a portion forming the channel of the thin film transistor was opened was formed, and the $SiO_2$ film 130f corresponding to the channel portion was RIE-processed with a mixed gas of Ar and $CF_4$.

Figure 16C:
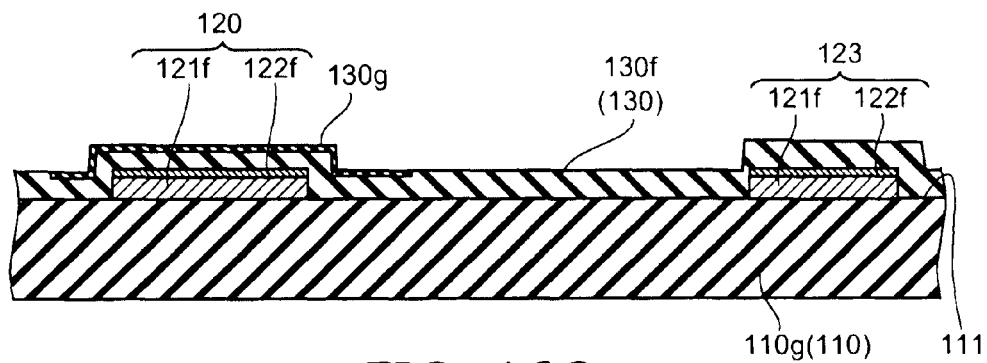

Thereby, as illustrated in FIG. 16C, a smoothed face 130g is formed at a portion not covered with the resist 130r. That is, RIE processing is performed on a region of the $SiO_2$ film 130f not covered with the resist 130r. This region is made smoother than the surface morphology of the $SiO_2$ film 130f (namely, the $SiO_2$ film 130f after film-formed by PE-CVD as it is) on which the RIE processing is not performed, and becomes the smoothed face 130g. By etching the $SiO_2$ film 130f with a depth of approximately 10 nm or more by the RIE processing, the surface of the $SiO_2$ film 130f is sufficiently smoothed.

The smoothed face 130g of the $SiO_2$ film 130f has a surface roughness of approximately 1 nm to 0.1 nm, for example, and a portion of the $SiO_2$ film 130f on which the surface processing for smoothing is not performed has a surface roughness of 10 nm to 5 nm, for example.

Figure 16D:
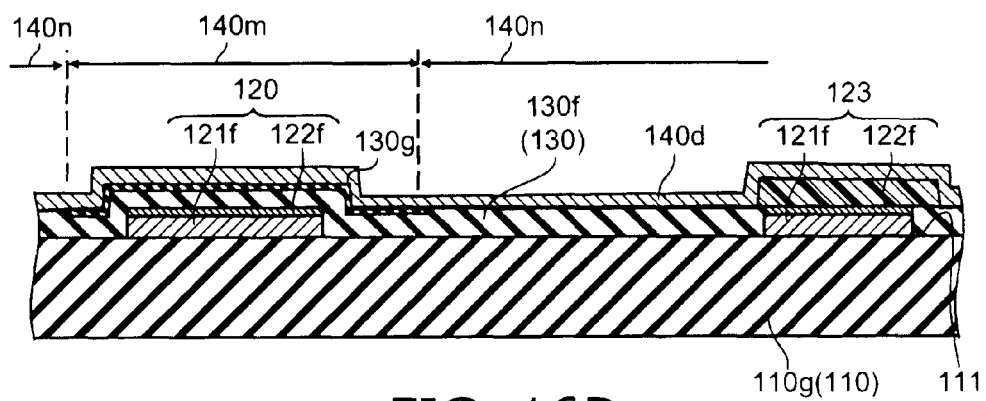

Further, as illustrated in FIG. 16D, on the $SiO_2$ film 130f including this smoothed face 130g, an In—Ga—Zn—O oxide film was film-formed with a thickness of 30 nm as the oxide layer 140f that forms the semiconductor layer 140 and the pixel electrode 140d by reactive DC sputtering. The ratio of oxygen was 5% to argon.

On the basis of the investigation on the film structure of this oxide layer 140f, it was found that the oxide layer 140f in regions 140n above portions except the smoothed face 130g had a columnar structure with grain sizes of approximately 10 nm to 30 nm. In contrast, it was also found that the oxide layer 140*f* in a region 140*m* above the smoothed face 130*g* had not a columnar structure but a uniform structure with an unobvious film structure.

Thus, by controlling the smoothness of the surface of the gate insulating film 130 that forms the under layer, the film structure of the oxide layer 140*f* film-formed thereon can be changed selectively, and thereby a high resistance region and a low resistance region can be formed selectively in the oxide layer 140*f*.

For example, while the resistance value is 0.1 Ωcm to 10 Ωcm in the case of the columnar structure with a rough under layer, the resistance value can be $1\times10^8$ Ωcm in the case of the uniform structure with a smooth under layer.

After that, the oxide layer 140*f* was patterned into a shape that connects the pixel electrode 140*d* and a prescribed channel pattern across the gate electrode 120 by using oxalic acid of 2%, and thus the shapes of the semiconductor layer 140 and the pixel electrode 140*d* were formed. Thereby, the semiconductor layer 140 with a high resistance is formed of the oxide layer 140*f* corresponding to the smoothed face 130*g*, and the pixel electrode 140*d* with a low resistance is formed of the oxide layer 140*f* corresponding to the region except the smoothed face 130*g*. When the pixel electrode 140*d* and one of the source electrode 161 and the drain electrode 162 of the thin film transistor are electrically connected by the oxide layer 140*f*, the gate insulating film 130 ($SiO_2$ film 130*f*) that forms the under layer of the connecting portion is made a not-smoothed region to become a low resistance portion.

After that, the processes described in regard to FIG. 14C to FIG. 15B, for example, are performed, and then the display device 52 according to the example is fabricated. However, a description is omitted.

Thus, in the display device 52 and the method for manufacturing the same according to the example, the pixel electrode 140*d* is formed of oxide used for the semiconductor layer 140, and has lower electric resistance than the semiconductor layer. That is, the same material as the semiconductor layer 140 that forms the channel, i.e., the same oxide layer 140*f* is used for the pixel electrode 140*d*. However, the film structure is different.

That is, the oxide layer 140*f* at the pixel electrode 140*d* may have a columnar structure. The grain size of the columnar structure is 10 nm to 30 nm (not less than 10 nanometers and lot greater than 20 nanometers), for example. On the other hand, the oxide layer 140*f* that forms the channel may have a uniform film structure, and in this case, no grain is observed. Thereby, the pixel electrode 140*d* can be made relatively lower resistive than the semiconductor layer 140 corresponding to the channel.

As mentioned above, the smoothness of the surface of the gate insulating film 130 that is the under layer can be selectively controlled, and thereby a portion of the oxide layer 140*f* which forms the pixel electrode 140*d* can be made selectively a columnar structure and the oxide layer 140*f* that forms the channel can be made a uniform film structure.

That is, the display device 52 further includes a film (the oxide layer 140*f*) that is provided under the pixel electrode 140*d* and made of the same material as the gate insulating film 130. This film has been described as the gate insulating film 130 in the above description.

Further, a surface of the gate insulating film 130 on the gate electrode 120 on a side of the semiconductor layer 140 is smoother than a surface of the film mentioned above (gate insulating film 130) provided under the pixel electrode 140*d* on a side of the pixel electrode 140*d*.

The surface roughness of the surface of the gate insulating film 130 on the gate electrode 120 on a side of the semiconductor layer 140 may be 0.1 nm to 1 nm (not less than 0.1 nanometers and not greater than 1 nanometer), for example. Thereby, the oxide layer 140*f* thereon has a uniform film structure and high resistance.

The surface roughness of the surface of the gate insulating film 130 under the pixel electrode 140*d* (the above-mentioned film formed of the same material as the gate insulating film 130) on a side of the pixel electrode 140*d* may be 5 nm to 10 nm (not less than 5 nanometers and not greater than 10 nanometers), for example. Thereby, the oxide layer 140*f* thereon has a columnar structure and low resistance.

Although the smoothed face 130*g* is formed by RIE in the above, the forming method is optional. Conversely, the portion of the pixel electrode 140*d* may be exposed and surface processing that increases roughness of the surface thereof may be performed.

That is, in the method for manufacturing the display device according to this embodiment, before the forming the oxide layer 140*f* (the layer of oxide), surface processing that selectively changes the smoothness of the surface of the gate insulating film 130 may be further performed. The performing the surface processing may includes making the surface of the gate insulating film 130 in a region (a third region) on which the pixel electrode 140*d* is formed relatively rougher than the other portions (a surface of the gate insulating film in a region except the third region). That is, the surface where the surface processing is performed may be a portion corresponding to the semiconductor layer 140 that forms the channel, or a portion corresponding to the pixel electrode 140*d*.

The display devices 51 and 52 according to this embodiment may be a matrix-type display device in which thin film transistors and pixel electrodes are arranged in a matrix form.

Figure 17A:
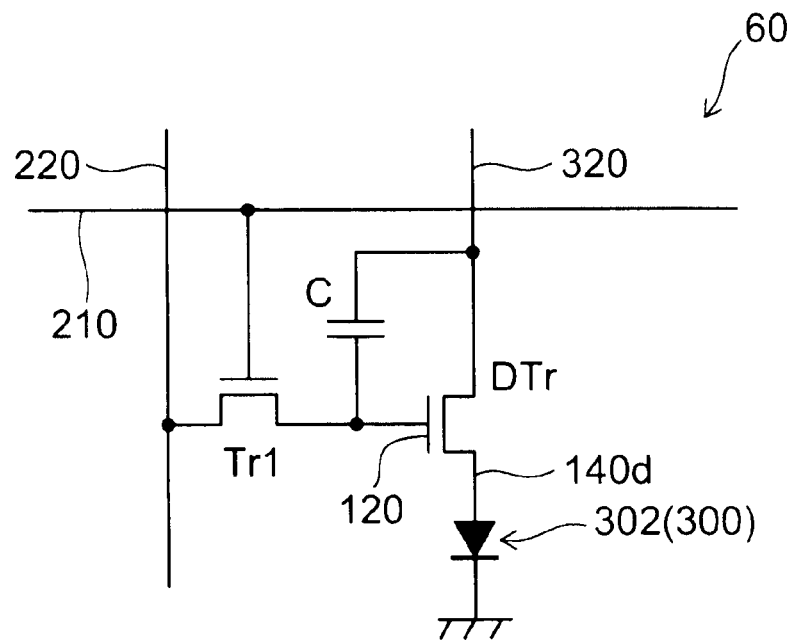
FIGS. 17A and 17B are circuit diagrams illustrating equivalent circuits of other display devices according to the second embodiment of the invention.
Figure 17B:
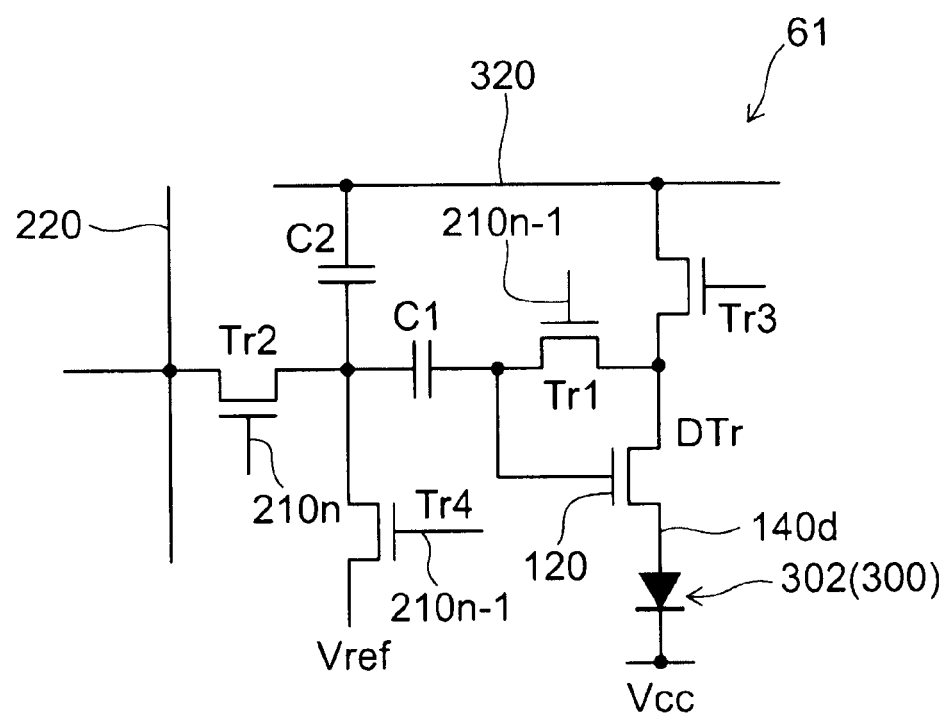

FIGS. 17A and 17B are circuit diagrams illustrating equivalent circuits of other display devices according to the second embodiment of the invention.

That is, FIGS. 17A and 17B illustrate equivalent circuits of two kinds of display devices of active matrix type using organic EL.

As illustrated in FIG. 17A, a display device 60 of active matrix type using organic EL according to this embodiment includes a first transistor Tr1 for pixel selecting, and a transistor for pixel driving DTr that is connected to a power source line 320 and drives an organic EL layer 302 (optical element 300). The gate of the first transistor Tr1 is connected to a scanning line 210, and the source is connected to a signal line 220. Any of the thin film transistors according to embodiments of the invention may be used for the first transistor Tr1 and the transistor for pixel driving DTr.

Further, as illustrated in FIG. 17B, another display device 61 of active matrix type using organic EL according to this embodiment includes a first to a fourth transistor Tr1 to Tr4 for pixel selecting and a transistor for pixel driving DTr. The gate of the second transistor Tr2 is connected to an nth scanning line $210_n$, and the gates of the first transistor Tr1 and the fourth transistor Tr4 are connected to an (n−1)th scanning line $210_{n-1}$. The source of the second transistor Tr2 is connected to the signal line 220. Any of the thin film transistors according to embodiments of the invention may be used for the first to the fourth transistor Tr1 to Tr4 and the transistor for pixel driving DTr.

Since these display devices 60 and 61 of active matrix type using organic EL use any of the thin film transistors according to embodiments of the invention, a display device with high performance and good manufacturability is obtained by the thin film transistor using an oxide semiconductor which suppresses characteristic variation due to the heat treatment.

Figure 18:
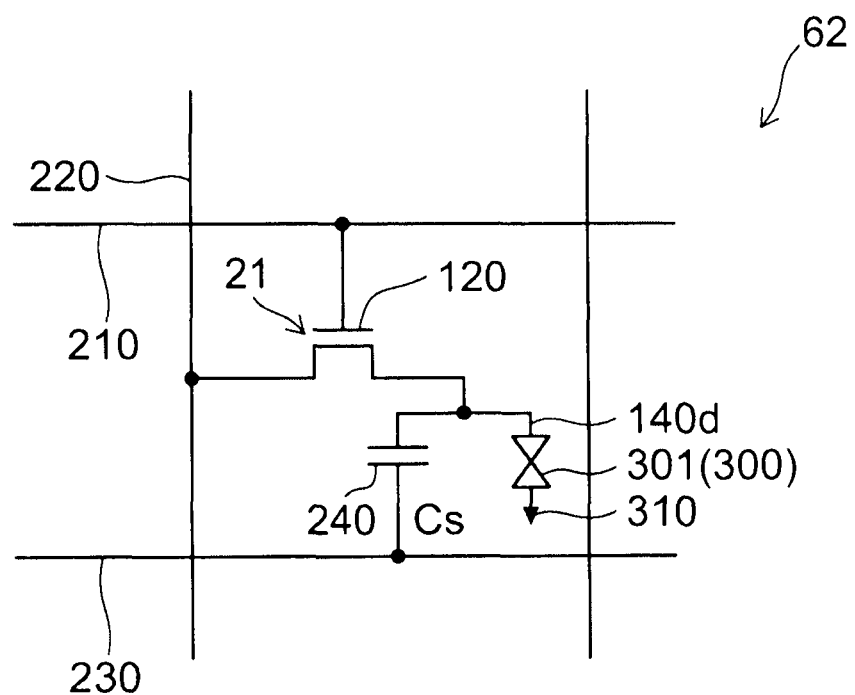
FIG. 18 is a circuit diagram illustrating an equivalent circuit of another display device according to the second embodiment of the invention.

FIG. 18 is a circuit diagram illustrating an equivalent circuit of another display device according to the second embodiment of the invention.

As illustrated in FIG. 18, in one element of a display device 62 of active matrix type according to the second embodiment of the invention, a liquid crystal layer 301 that forms the optical element 300 is an electric load placed between the pixel electrode 140d and a counter electrode 310, and is connected in parallel to an auxiliary capacitance Cs that is formed by auxiliary capacitance electrodes 240. The auxiliary capacitance electrodes 240 are connected to an auxiliary capacitance line 230. The pixel electrode 140d is connected to the signal line 220 via a thin film transistor 21. The gate electrode 120 of the thin film transistor 21 is connected to the scanning line 210. The gate electrode 120 of the thin film transistor 21 is switched to ON or OFF sequentially by the scanning line 210 to write a desired charge in the liquid crystal layer 301, and thus the display device 62 performs displaying.

Since the display device 62 of active matrix type using liquid crystal uses any of the thin film transistors according to embodiments of the invention, a display device with high performance and good manufacturability is obtained by the thin film transistor using an oxide semiconductor which suppresses characteristic variation due to the heat treatment.

Thus, the display devices 60, 61, and 62 according to this embodiment include: a plurality of thin film transistors according to embodiments of the invention which are arranged in a matrix form; a scanning lines 210, connected to each gate electrode of the thin film transistors; the signal lines 220, connected to another of the source electrode 161 and the drain electrode 162 of the thin film transistors; a pixel electrode 140d connected to the other of each source electrode and each drain electrode of the thin film transistors; and an optical element 300 that emits light by an electric signal provided to the pixel electrodes 140d.

Thus, the display device according to this embodiment further includes: a plurality of thin film transistors according to embodiments of the invention and a plurality of the pixel electrodes 140d, each of the pixel electrode 140d connected to one of each source electrode 161 and each drain electrode 162 of the thin film transistors, the plurality of the thin film transistors and the plurality of the pixel electrodes 140d being arranged in a matrix form; a plurality of the scanning lines 210, each of the plurality of the scanning lines 210 being connected to each of the gate electrodes 120 of each of the plurality of the thin film transistors; and a plurality of the signal lines 220, each of the plurality of the signal lines 220 being connected to another of the source electrode 161 and the drain electrode 162 of each of the plurality of the thin film transistors. The optical element 300 produces at least one of a change in optical characteristics and light emitting by an electric signal provided to each of the pixel electrodes 140d.

At this time, the pixel electrode 140d mentioned above may be formed of the oxide layer 140f that forms the semiconductor layer 140 of the thin film transistor, and may have lower electric resistance than the semiconductor layer 140.

However, the invention is not limited thereto, but the configuration of the pixel electrode 140d is optional as far as using any of the thin film transistors according to embodiments of the invention. Here, as described previously, the pixel electrode 140d may be made of the oxide layer 140f that forms the semiconductor layer 140 of the thin film transistor and may have lower electric resistance than the semiconductor layer 140. This can omit processes for forming another conductive film as the pixel electrode 140d, and provide advantage.

(Third Embodiment)

A third embodiment of the invention is a method for manufacturing a thin film transistor.

That is, it is a method for manufacturing a thin film transistor that includes: a substrate 110g; a gate electrode 120 provided on the substrate 110g; a gate insulating film 130 provided on the gate electrode 120; a semiconductor layer 140 provided on the gate insulating film 130, the semiconductor layer 140 being formed of oxide; a source electrode 161 and a drain electrode 162 provided on the semiconductor layer 140, the source electrode 161 being opposed to one end of the gate electrode 120, the drain electrode 162 being opposed to another end of the gate electrode 120, the another end being opposite to the one end, the drain electrode 162 being apart from the source electrode 161; and a channel protecting layer 150 provided between the source and drain electrodes 161, 162 and the semiconductor layer 140. Portions of the manufacturing method will now be described.

Figure 19:
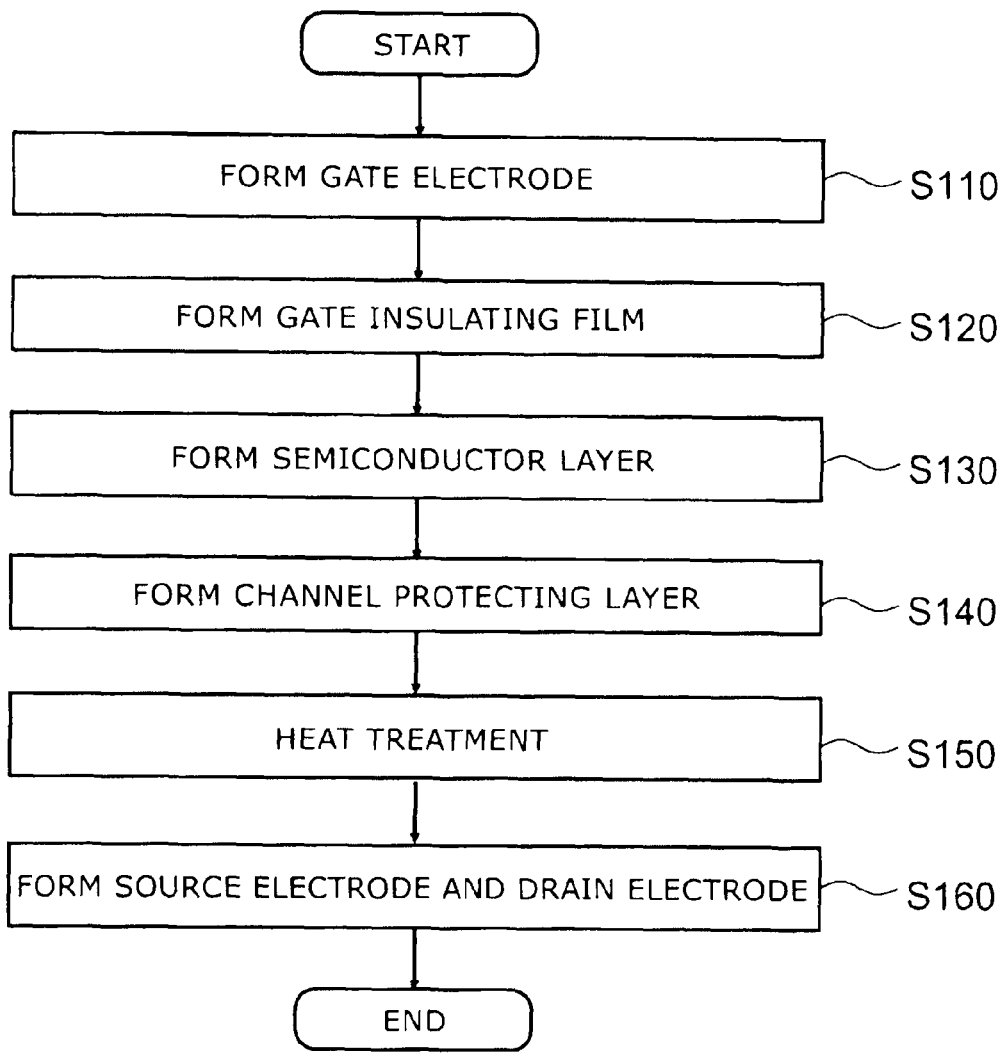
FIG. 19 is a flow chart illustrating a method for manufacturing a thin film transistor according to a third embodiment of the invention.

FIG. 19 is a flow chart illustrating a method for manufacturing a thin film transistor according to the third embodiment of the invention.

As illustrated in FIG. 19, in the method for manufacturing the thin film transistor according to this embodiment, first, the gate electrode 120 is formed on the substrate 110g (step S110).

Then, the gate insulating film 130 is formed on the gate electrode 120 (step S120).

Then, the semiconductor layer 140 is formed on the gate insulating film 130 (step S130).

Subsequently, the channel protecting layer 150 is formed covering at least a part of a side face 140s of the semiconductor layer 140 above the gate electrode 120 (step S140). That is, for example, the channel protecting layer 150 is formed so as to cover at least part of the side face 140s of the semiconductor layer 140 except regions of the semiconductor layer 140 connected to the source electrode 161 and the drain electrode 162. At this time, an upper face 140u of the semiconductor layer 140 is also covered.

Subsequently, a heat treatment is performed on the semiconductor layer 140 and the channel protecting layer 150 at a temperature not less than 160° C. (step S150).

After the performing the heat treatment, the source electrode 161 and the drain electrode 162 are formed on the semiconductor layer 140 and the channel protecting layer 150 (step S160). That is, for example, the source electrode 161 and the drain electrode 162 are formed on regions of the semiconductor layer 140 which are to be connected to the source electrode 161 and the drain electrode 162, respectively.

That is, in the manufacturing method mentioned above, the method described in regard to FIGS. 2A to 2C and FIGS. 3A and 3B may be used.

According to the manufacturing method mentioned above, damages in the semiconductor layer 140 which occur during film-formation of the channel protecting layer 150 can be recovered by the heat treatment in step S150. Performing step S160 after this heat treatment (step S150) does not cause damages in the source electrode 161 and the drain electrode 162. Furthermore, at least part of the side face 140s (and upper face 140u) that could be a current path in the semiconductor layer 140 is protected by the channel protecting layer 150 at the time of this heat treatment (step S150). Thereby, oxygen does not leave the semiconductor layer 140 and a decrease of the resistivity can be prevented. This can provide a method for manufacturing a thin film transistor using an oxide semiconductor which suppresses characteristic variation due to the heat treatment.

In step S140 mentioned above, the channel protecting layer 150 may be formed covering at least the part of the side face 140s of the semiconductor layer 140 which is placed between an extension line 161p (a first extension line) and an extension line 162p (a second extension line). The extension line 161 is an extension line of a side (a first side) of a region (a first region) where the source electrode 161 is to be formed. The extension line 162 is an extension line of a side (a second side) of a region (a second region) where the source electrode 162 is to be formed. The first side is opposed to the region (the second region) where the drain electrode 162 is to be formed and the second side is opposed to the region (the first region) where the source electrode 161 is to be formed. Thus, the channel protecting layer 150 may be formed covering at least the part of the side face 140s of the semiconductor layer between an extension line 161p (a first extension line) of a first side of a first region and an extension line 162p (a second extension line) of a second side of a second region, the source electrode 161 being to be formed in the first region, the drain electrode 162 being to be formed in the second region, the first side being opposed to the second region, the second region being opposed to the first region. Thereby, the current path mentioned above can be cut off efficiently.

(Fourth Embodiment)

A fourth embodiment of the invention is a method for manufacturing a display device. That is, it is a method for manufacturing a display device that includes: a thin film transistor including: a substrate 110g; a gate electrode 120 provided on the substrate 110g; a gate insulating film 130 provide on the gate electrode 120; a semiconductor layer 140 provided on the gate insulating film 130, the semiconductor layer 140 being formed of oxide; a source electrode 161 and a drain electrode 162 provided on the semiconductor layer 140, the source electrode 161 being opposed to one end of the gate electrode 120, the drain electrode 162 being opposed to another end of the gate electrode 120, the another end being opposite to the one end, the drain electrode 162 being apart from the source electrode 162; and a channel protecting layer 150 provided between the source and drain electrodes 161, 162 and the semiconductor layer 140; a pixel electrode 140d connected to one of the source electrode 161 and the drain electrode 162; and an optical element 300 producing at least one of a change in optical characteristics and light emitting by an electric signal provided to the pixel electrode 140d. Portions of the manufacturing method will now be described.

Figure 20:
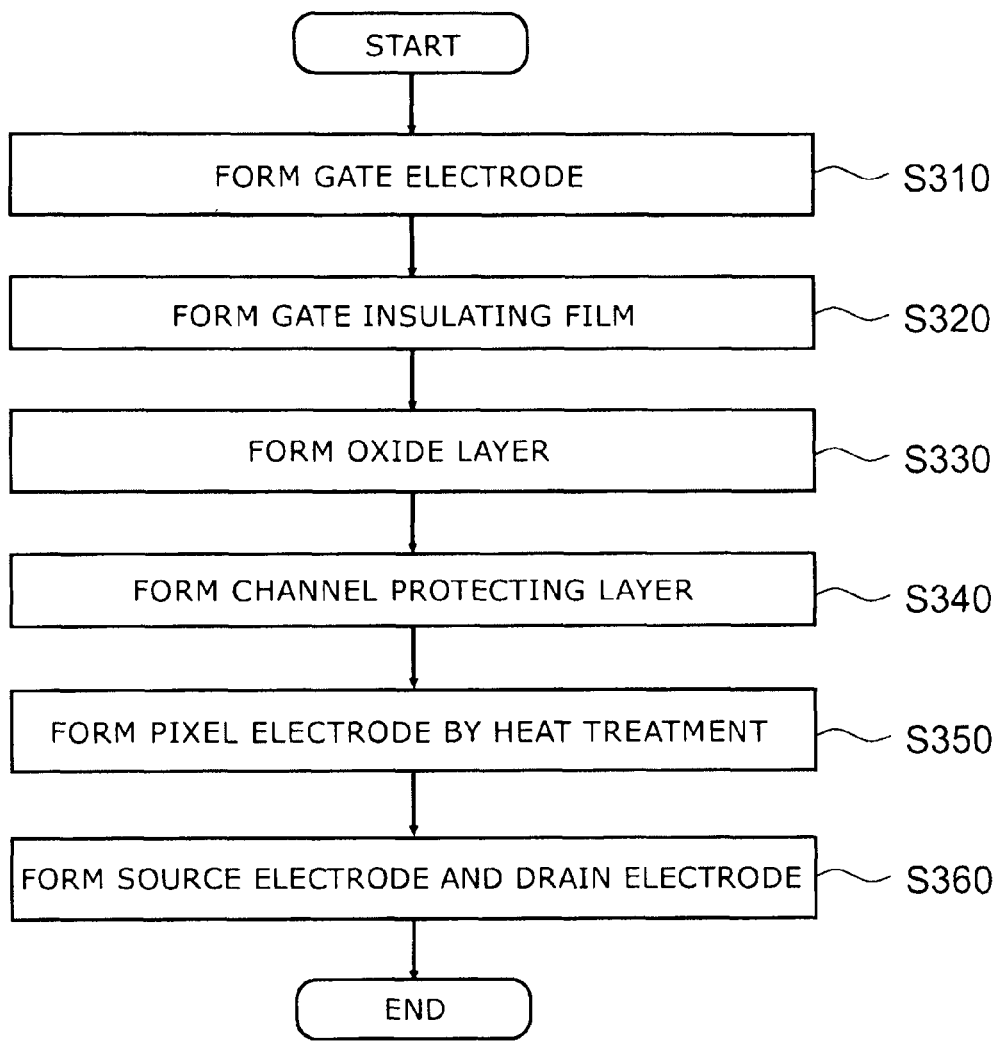
FIG. 20 is a flow chart illustrating a method for manufacturing a display device according to a fourth embodiment of the invention.

FIG. 20 is a flow chart illustrating a method for manufacturing a display device according to the fourth embodiment of the invention.

As illustrated in FIG. 20, in the method for manufacturing a display device according to this embodiment, first, the gate electrode 120 is formed on the substrate 110g (step S310).

Then, the gate insulating film 130 is formed on the gate electrode 120 (step S320).

Then, an oxide layer 140f (a layer of oxide) that forms the semiconductor layer 140 and the pixel electrode 140d is formed on the gate insulating film 130 (step S330).

Subsequently, the channel protecting layer 150 covering at least a part of a side face of the oxide layer 140f (the layer of the oxide) above the gate electrode 120 and exposing the oxide layer 140f in a region (a third region), the pixel electrode 140d being to be formed in the third region (step S340). That is, for example, the channel protecting layer 150 is formed so as to cover at least part of a side face 140s (and upper face 140u) of the oxide layer 140f except regions (for example the first region and the second region mentioned above) of the semiconductor layer 140 connected to the source electrode 161 and the drain electrode 162, and to expose the oxide layer 140f in a region (the third region) in which the pixel electrode 140d is to be formed.

Subsequently, a heat treatment on the oxide layer 140f and the channel protecting layer 150 at a temperature not less than 160° C. is performed to decrease the electric resistance of the oxide layer 140f not covered with the channel protecting layer 150 to form the pixel electrode 140d (step S350).

After the performing the heat treatment, the source electrode 161 and the drain electrode 162 are formed on the semiconductor layer 140 and the channel protecting layer 150 (step S360). That is, the source electrode 161 and the drain electrode 162 are formed on regions of the semiconductor layer 140 which are to be connected to the source electrode 161 and the drain electrode 162, respectively.

That is, in the manufacturing method mentioned above, the method described in regard to FIGS. 14A to 14C and FIGS. 15A and 15B may be used.

The method for manufacturing a display device according to this embodiment can omit processes for forming another film that forms the pixel electrode 140d, and provide a display device of high productivity using an oxide semiconductor which suppresses characteristic variation due to the heat treatment, and a method for manufacturing the same.

In step S340 mentioned above, the channel protecting layer 150 may be formed covering at least the part of the side face 140s of the semiconductor layer between an extension line 161p (a first extension line) of a first side of a first region and an extension line 162p (a second extension line) of a second side of a second region, the source electrode 161 being to be formed in the first region, the drain electrode 162 being to be formed in the second region, the first side being opposed to the second region, the second region being opposed to the first region. Thereby, the current path mentioned above can be cut off efficiently.

Figure 21:
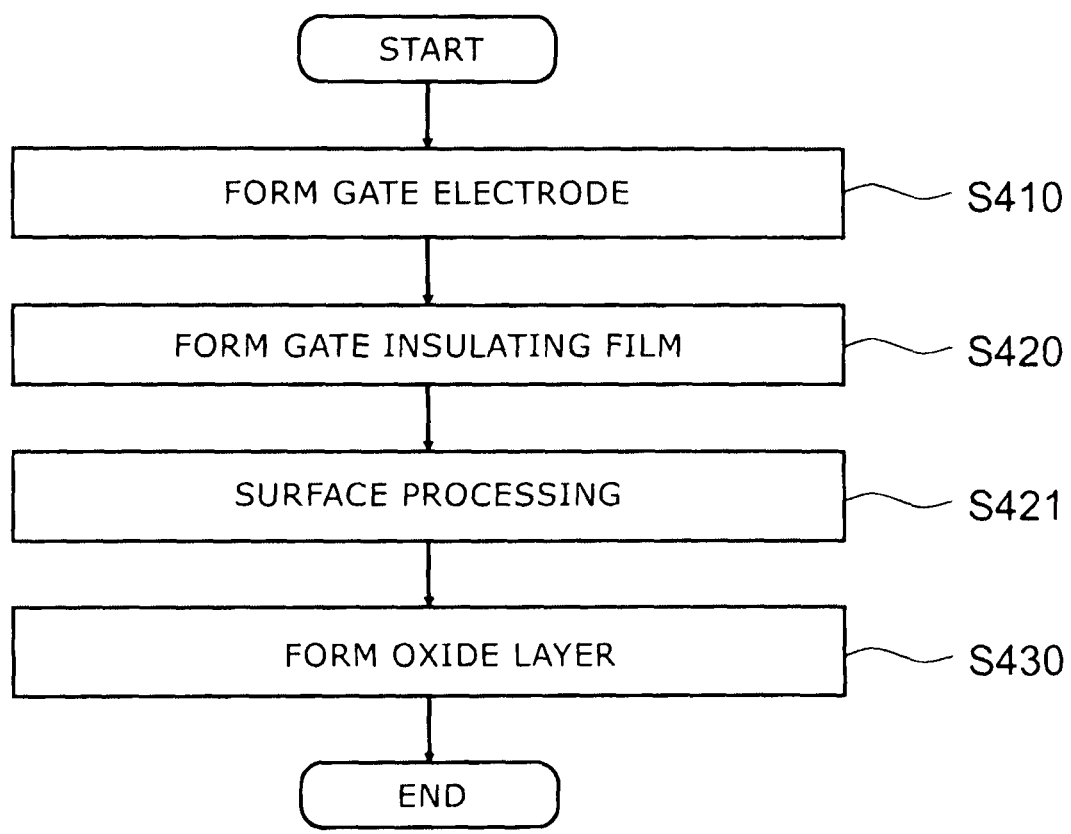
FIG. 21 is a flow chart illustrating another method for manufacturing a display device according to the fourth embodiment of the t invention.

FIG. 21 is a flow chart illustrating another method for manufacturing a display device according to the fourth embodiment of the invention.

As illustrated in FIG. 21, in the other manufacturing method, first, the gate electrode 120 is formed on the substrate 110g (step S410).

Then, the gate insulating film 130 is formed on the gate electrode 120 (step S420). The gate insulating film 130 is formed in a region (the third region) where the pixel electrode 140d is to be formed as well as on the gate electrode 120. That is, a portion of the gate insulating film 120 is used as the under layer of the pixel electrode 140d.

Then, surface processing that selectively changes the smoothness of a surface of the gate insulating film 130 is performed (step S421). That is, for example, a portion of the gate insulating film 130 which forms the under layer of the semiconductor layer 140 serving as the channel is processed by RIE to be smoothed.

At this time, the gate insulating film 130 that forms the under layer of the pixel electrode 140d is protected with, for example, a resist so that the surface does not to be smoothed. Further, a desired portion other than the pixel electrode 140d may not be smoothed to fabricate an optional conductive region which can be used as a wiring section, for example.

After that, a layer of the oxide mentioned above is formed on the gate insulating film 130 (step S430). That is, the oxide layer 140f that forms the semiconductor layer 140 and the pixel electrode 140d is formed. Thereby, a portion of the oxide layer 140f which forms the pixel electrode 140d becomes a columnar structure and relatively low resistive, for example.

This can omit processes for forming another film that forms the pixel electrode 140d, and provide a display device of high productivity using an oxide semiconductor and a method for manufacturing the same.

Prior to the forming the oxide layer 140f of step S330 described in FIG. 20, the surface processing of step S421 mentioned above that selectively changes the smoothness of a surface of the gate insulating film 130 that forms the under layer of the oxide layer 140f may be further performed.

That is, between step S320 and step S330 illustrated in FIG. 20, the smoothness of surface is made different between: the gate insulating film 130 under the semiconductor layer 140 that forms the channel; and the gate insulating film 130 under the pixel electrode 140d. For example, the surface processing mentioned above may be surface processing that makes the surface of the gate insulating film 130 in a region on which the pixel electrode 140d is formed relatively rougher than the other portions.

Hereinabove, embodiments of the invention are described with reference to specific examples. However, the invention is not limited to these examples. For example, one skilled in the art may appropriately select specific configurations of components of the thin film transistor, the method for manufacturing the same, the display device, and the method for manufacturing the same from known art and similarly practice the invention; and such practice is included in the scope of the invention to the extent that similar effects thereto are obtained.

Further, any two or more components of the specific examples may be combined within the extent of technical feasibility. Such combination is included in the scope of the invention to the extent that the spirit of the invention is included.

Moreover, all thin film transistors, methods for manufacturing the same, display devices, and methods for manufacturing the same that can be obtained by an appropriate design modification by one skilled in the art based on the thin film transistor, the method for manufacturing the same, the display device, and the method for manufacturing the same described above as embodiments of the invention are also within the scope of the invention to the extent that the spirit of the invention is included.

Furthermore, one skilled in the art may arrive at various alterations and modifications within the idea of the invention. Such alterations and modifications should be seen as within the scope of the invention.

The invention claimed is:

1. A display device comprising:
a thin film transistor including:
an insulating layer;
a gate electrode provided on the insulating layer;
a gate insulating film provided on the gate electrode;
a semiconductor layer provided on the gate electrode, the semiconductor layer being formed of oxide;
a source electrode and a drain electrode provided on the semiconductor layer, the source electrode being opposed to one end of the gate electrode, the drain electrode being opposed to another end of the gate electrode, the another end being opposite to the one end, the drain electrode being apart from the source electrode,
a pixel electrode connected to one of the source electrode and the drain electrode, the pixel electrode being formed of the oxide and having a lower electric resistance than the semiconductor layer;
an optical element producing at least one of a change in optical characteristics and light emitting by an electric signal provided to the pixel electrode; and
a film provided under the pixel electrode and formed of the same material as the gate insulating film,
a surface of the gate insulating film on a side of the semiconductor layer being smoother than a surface of the film on a side of the pixel electrode.

2. The device according to claim 1, wherein
a thin film transistor includes a channel protecting layer including:
a first portion provided between the source electrode and the semiconductor layer,
a second portion provided between the drain electrode and the semiconductor layer, and
a third portion covering at least a part of a side face of a part of the semiconductor layer, the part of the semiconductor layer being not covered with the source electrode and the drain electrode above the gate electrode, and
the pixel electrode is not covered with the channel protecting layer.

3. The device according to claim 2, wherein the third portion covers at least the part of the side face of the semiconductor layer between an extension line of a side of the source electrode opposed to the drain electrode and an extension line of a side of the drain electrode opposed to the source electrode.

4. The device according to claim 3, wherein the third portion further covers an upper face of the semiconductor layer between the extension line of the side of the source electrode opposed to the drain electrode and the extension line of the side of the drain electrode opposed to the source electrode.

5. The device according to claim 2, wherein the channel protecting layer contains oxygen.

6. The device according to claim 1, wherein a concentration of oxygen contained in the pixel electrode is lower than a concentration of oxygen contained in the semiconductor layer.

7. The device according to claim 1, wherein the oxide in the pixel electrode has a columnar structure.

8. The device according to claim 7, wherein the columnar structure in the oxide in the pixel electrode has a columnar grain larger than a grain in the oxide in the semiconductor layer.

9. The device according to claim 1, wherein surface roughness of the surface of the film on the side of the pixel electrode is not less than five nanometers and not greater than ten nanometers.

10. The device according to claim 9, wherein the surface roughness of the surface of the gate insulating film on a side of the semiconductor layer is not less than 0.1 nanometers and not greater than one nanometer.

11. The device according to claim 1, further comprising:
a plurality of the thin film transistors and a plurality of the pixel electrodes, each of the plurality of the pixel electrodes being connected to one of the source electrode and the drain electrode of each of the plurality of the thin film transistors, the plurality of the thin film transistors and the plurality of the pixel electrodes being arranged in a matrix form;
a plurality of scanning lines, each of the plurality of the scanning lines being connected to gate electrodes of a plurality of the thin film transistors; and
a plurality of signal lines, each of the plurality of the signal lines being connected to another one of the source electrode and the drain electrode of a plurality of the thin film transistors.

12. The device according to claim 1, wherein the semiconductor layer includes an amorphous oxide which contains Zn.

13. The device according to claim 12, wherein the amorphous oxide further contains at least one of In and Ga.

14. The device according to claim 1, wherein the thin film transistor further includes a channel protecting layer including:
- a first portion provided between the source electrode and the semiconductor layer,
- a second portion provided between the drain electrode and the semiconductor layer, and
- a third portion covering at least a part of a side face of a part of the semiconductor layer, the part of the semiconductor layer being not covered with the source electrode and the drain electrode above the gate electrode.

* * * * *